United States Patent [19]

Rosen et al.

[11] Patent Number: 6,099,164
[45] Date of Patent: *Aug. 8, 2000

[54] SENSORS INCORPORATING NICKEL-MANGANESE OXIDE SINGLE CRYSTALS

[75] Inventors: Carol Zwick Rosen, Teaneck; John Carter, Jr., Lebanon, both of N.J.

[73] Assignee: Thermometrics, Inc., Edison, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/488,331

[22] Filed: Jun. 7, 1995

[51] Int. Cl.⁷ .......................................... G01K 7/01

[52] U.S. Cl. .................. 374/185; 338/22 R; 338/22 SD; 338/25; 117/946; 501/1

[58] Field of Search .......................... 374/185; 338/22 R, 338/25, 22 SD; 423/594, 599; 501/1, 94; 117/946

[56] References Cited

U.S. PATENT DOCUMENTS

| | | |
|---|---|---|
| 3,343,151 | 9/1967 | Brown et al. . |
| 3,510,820 | 5/1970 | Jonker et al. . |
| 3,568,125 | 3/1971 | Villemant et al. ..................... 338/22 R |
| 3,612,535 | 10/1971 | Davis et al. . |
| 3,745,506 | 7/1973 | Bethe . |
| 3,846,776 | 11/1974 | Kahn . |
| 3,876,382 | 4/1975 | Falckenberg . |
| 3,898,051 | 8/1975 | Schmid . |
| 4,324,702 | 4/1982 | Matsuo et al. . |
| 4,347,166 | 8/1982 | Tosaki et al. . |
| 4,519,870 | 5/1985 | Matsuzawa et al. . |
| 4,729,852 | 3/1988 | Hata . |
| 4,840,925 | 6/1989 | Rousset et al. .......................... 423/594 |
| 4,891,158 | 1/1990 | Hata . |
| 4,952,902 | 8/1990 | Kawaguchi et al. . |
| 5,043,692 | 8/1991 | Sites et al. . |
| 5,246,628 | 9/1993 | Jung et al. . |
| 5,301,681 | 4/1994 | DeBan et al. ........................... 128/736 |
| 5,653,954 | 8/1997 | Rosen et al. . |

FOREIGN PATENT DOCUMENTS

| | | |
|---|---|---|
| 742384 | 9/1996 | Canada . |
| 0 609 776 A1 | 8/1994 | European Pat. Off. . |
| 0 687 656 A1 | 12/1995 | European Pat. Off. . |
| 2-143502 | 6/1990 | Japan . |
| 3-136206 | 6/1991 | Japan . |
| 3-214702 | 9/1991 | Japan . |
| 3-214703 | 9/1991 | Japan . |
| 1002704 | 8/1965 | United Kingdom . |

OTHER PUBLICATIONS

"Electrical and Crystallographic Studies of the System $Cu_xNi_1Mn_2O_4$", by S.T. Kshirsagar, Journal of the Physical Society of Japan, vol. 27, No. 5 (1969).

"Solid–Phase Equilibria in the System $NiO-Mn_2O_3-O_2$", by D.G. Wickham, J. Inorg. Nucl. Chem., (1964), vol. 26, pp. 1369 to 1377.

Preparation, Semidonduction and Low–Temperature Magnetization of the System $Ni_{1-x}Mn_{2+x}O_4$" by E.G. Larson and R.J. Arnott, J. Phys. Chem. Solids, vol. 23, pp. 1771–0781.

Villers et al. "Preparation, etudes cristalines et magnetiques du managanite de Nickel $NiMn_2O_4$", C.R. Acad. Sc. Paris, t. 260, Mar. 22, 1965, pp. 3406–3409.

"Preparation of HFC Single Crystals by a Floating Zone Technique", Journal of Cyrstal Growth (1981), Shigeki Otani and Takaho Tanaka.

"Phase Equilibria in the Ferrite Region of the System $FeO-MgO-Fe_2O_3$", by A.E. Paladino, Journal of the American Ceramic Society–, vol. 43, No. 4 (Apr. 1960).

(List continued on next page.)

Primary Examiner—Christopher W. Fulton
Assistant Examiner—Lydia De Jesus
Attorney, Agent, or Firm—Lerner, David, Littenberg, Krumholz & Mentlik, LLP

[57] ABSTRACT

The invention is directed to a thermistor created using a monocrystalline form of a nickel-manganese-oxide cubic spinel and methods of using same as a sensor in an electrical circuit.

10 Claims, 13 Drawing Sheets

OTHER PUBLICATIONS

"Effect of Temperature on the Structure of Manganites", by K.S. Irani, A.P.E. Sinha, and A.B. Biswas, J. Phys. Chem. Solids (1962) vol. 23, pp. 711–727.

"Preferential Volatillization of Cations from Ferrites During Sintering" by J.M. Brownlow (1958), Journal of Applied Physics, vol. 29, No. 3.

"Theory of shape stability in crystal growth from the melt", by T. Surek, (1976), J. Appl. Phys., vol. 47, No. 10.

"Mn–Ni–Cu–O Quaternary NTC Ceramic Thermistor Studied by X–ray Photoelectron Spectroscopy", by T. Hashemi, Applied Physics, (1991), vol. 90, No. 6.

"Influence of Particle Size on the Coercive Force of Barium Ferrite Powders", by R.K. Tenzer, Journal of Applied Physics, vol. 34, No. 4 (1963).

"Formation, structure, and bonding of Ni–Co–Mn oxides having spinel–type strukture", by Leonard V. Azaroff, Zeitschrift fur Kristallographie, Bd. 112, S 33–43 (1959).

"Electrical Properties and Cation Valencies in $Mn_3O_4$," by S.E. Dorris and T.O. Mason, J. AM. Ceram. Soc., 71 pp. 379–85 (1988).

"Growth of Nickel Manganite Single Crystals", by H. Makram, Journal of Crystal Growth, (1967).

"Electrical Conductivity and Cation Valencies in Nickel Manganite", by V.A.M. Brabers and J.C.J.M. Terhell, Electrical Conductivity and Valencies, (1981) p. 325.

D. G. Wickham, "The Synthesis of Ferrites and Preparation of Cobalt Ferrite Single Crystals," Thesis, pp. iii–124. (No Date).

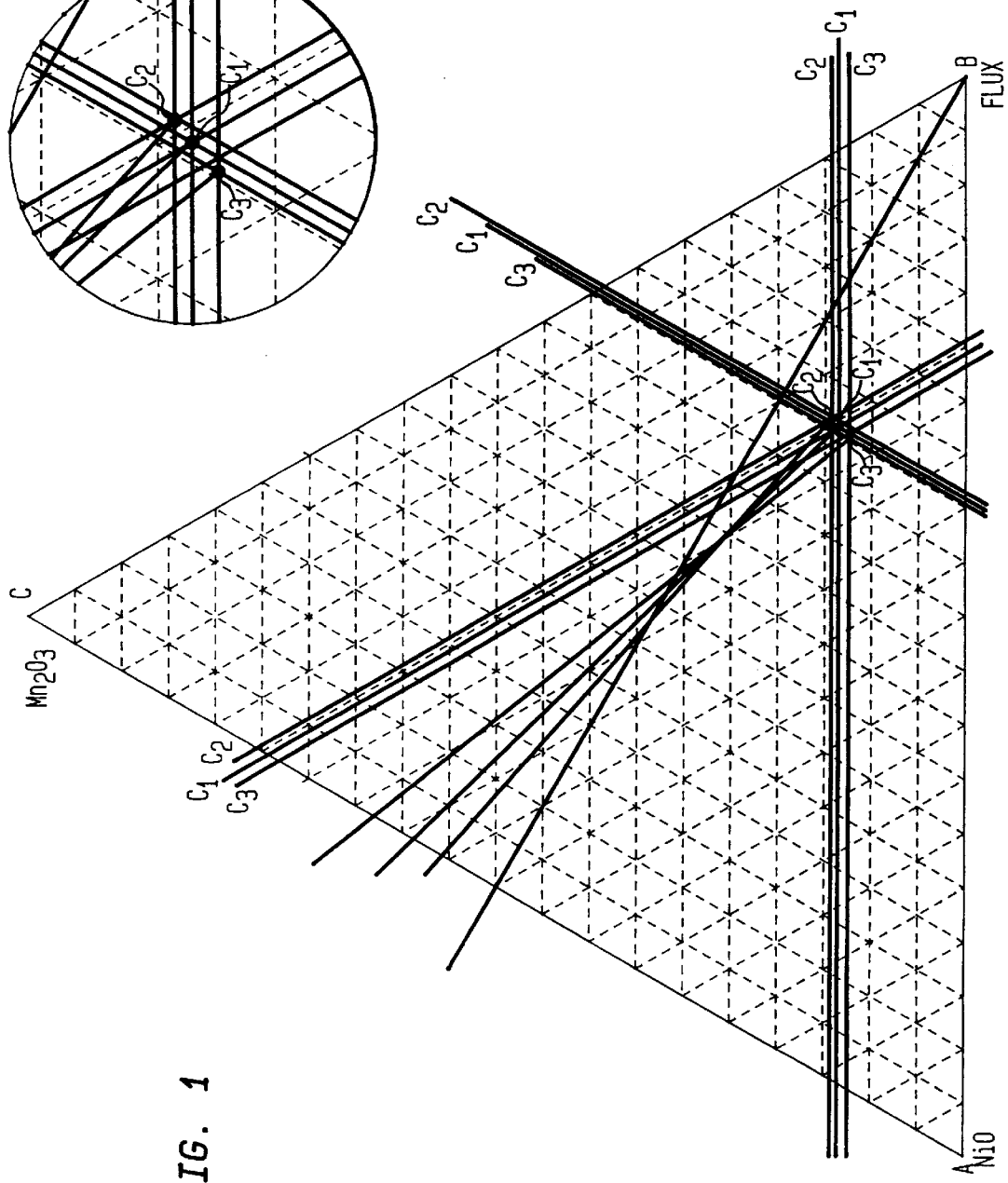
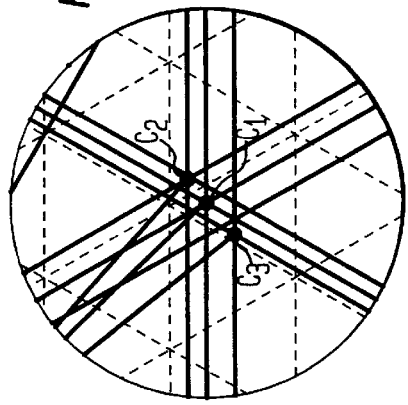
FIG. 1
FIG. 1A

SENSORS INCORPORATING NICKEL-MANGANESE OXIDE SINGLE CRYSTALS

FIELD OF THE INVENTION

The invention relates to the field growing monocrystals, particularly of nickel-manganese-oxide with cubic spinel structure, methods of their production and their use.

BACKGROUND OF THE INVENTION

Monocrystalline materials offer a high degree of uniformity in terms of their physical properties as well as a high degree of repeatability and efficiency when compared to polycrystals of the same material. Therefore, monocrystals or single crystals are highly prized as replacements for polycrystalline materials, wherever such materials are used. Moreover, because of their highly desirable properties, monocrystalline materials are sought out for applications for which polycrystalline material would never be considered. For example, in optical applications, polycrystals will provide a diffuse reflection of incident light whereas monocrystals would yield specular reflection.

In accordance with the present invention, and indeed generally, monocrystals can be differentiated from polycrystals based on a number of factors. Monocrystals are sized and shaped such that they can be used individually in the production of sensors, probes and the like. Polycrystalline materials are those made up of a composite of many individual crystals. Many ceramic materials are polycrystalline in nature as are many rocks and fabricated metals. The size of these polycrystals are usually small with equivalent diameters in many materials varying from a few micrometers to about 100 micrometers. Much larger crystallites are possible. However, because of physical properties such as, for example, packing density and other issues common in the ceramics field, it is usually advantageous to insure that the individual crystals do not get too large and are of as uniform a size and composition as possible. In the context of the present invention, however, when referring to a single crystal, preferably, an isolated crystal which is large enough to manipulate i.e. sliced or shaped, is envisioned. This allows one to take advantage of the properties of same with respect to the individual orientation of the crystal. In preferred embodiment, individual crystals are about 100 microns in size or greater and more preferably, at least about a millimeter in size or greater, along one edge. Certainly, crystals of a centimeter on a single edge would be considered rather large.

There are other significant differences as well, most of which stem directly from the fact that monocrystals are, as their name implies, singular, whereas polycrystals involve the interaction of at least two crystals and suffer from charge carrier scattering at their grain boundaries, where modifications to the electric conductivity likely takes place. In fact, transport processes such as resistivity and dielectric properties of the crystal differ considerably from those of ceramic samples. Polycrystalline materials can be thought of as a composite material made up of two or more distinct individual components. Just as the polycrystalline materials are composites of the individual crystals, so too are their properties. Polycrystals have voids and often certain other stoichiometry and phases. These features each have an effect on the overall properties of the material and any device or sensor made using them. For example, the dielectric tensor of semiconducting polycrystalline materials is less than that of the corresponding semiconducting monocrystal of that same material because of the presence of voids. The resistivity of the polycrystalline material is also affected thereby. Monocrystals, which do not suffer from such composite properties will not exhibit such a strong dispersion in their impedance-frequency characteristics.

Moreover, since no two groups of polycrystals can be exactly the same, i.e. same number of crystals of identical size, orientation, stoichiometry and composite properties, the response of one sensor made with one group of polycrystals may vary with respect to other such sensors. Polycrystals may also be problematic because they may absorb water, particularly in the voids between crystals. When such material is exposed to variations in humidity, "aging" or a lack of reproducibility of properties over temperature may be accelerated in comparison to comparable monocrystals. Moreover, the size of the voids between individual polycrystals may change with time and exposure to the elements and in response to external electric fields. Again, the thermal and electrical properties of the resulting material may therefore change over time. Monocrystals do not suffer from these same aging limitations.

Finally, with regard to certain materials and in particular nickel-manganese-oxide cubic spinel crystals, there may be magnetic ordering effects at lower temperatures in monocrystals. But with polycrystals, exposure to a magnetic field may cause movement of the individual crystals. This would result in a change in the grain boundaries and the size and shape of any voids and lead to hysteretic effects (non-reproducibility). The composite properties of the material would change accordingly. Certainly, the magnetic, thermal and electric properties of monocrystals can be more accurately measured and more repeatedly relied upon than polycrystalline materials.

Monocrystals of nickel-manganese-oxide cubic spinel are particularly desirable. While they would not suffer from the disadvantages of polycrystals, they would exhibit all of the advantageous properties of polycrystals of the same material. It is known, for example, that nickel-manganese-oxide cubic spinel polycrystals exhibit a very variable electric conductivity over a generally small temperature interval such as, −55° C. through 125° C. With crystal doping, these ranges can be modified and/or extended in either direction. Thermistors made of monocrystalline nickel-manganese-oxide cubic spinel crystals, therefore, would be particularly desirable for use in sensors, thermometers and temperature responsive circuits.

Cubic spinel crystals such as the crystals of the present invention, provide isotropic properties when compared to crystals of other geometric configurations. For example, transport processes, such as electric conductivity, are isotropic.

Polycrystals of nickel-manganese-oxide have been reported by a number of investigators and, in particular Dr. D. G. Wickham, et al.[1][2] and their properties have been studied and documented. Dr. Wickham's work, along with his collaborators, illustrated and characterized many of the advantageous properties of cubic spinel nickel-manganese oxide polycrystals and also provided phase diagrams for the system.

Nickel manganate monocrystals have, at least allegedly, been produced by at least two prior investigators. In "Growth of Nickel Manganate Mono-Crystals",[4] H. Makram reported the growth of $NiMn_2O_4$ crystals having a ratio of two parts manganese to one part nickel using a flux method. The crystals were described by Makram as being sound and flawless and having linear dimensions of up to six millimeters. Crystals were grown in a flux of bismuth and boron oxides. The composition was described as being 56.7 Mol % $Bi_2O_3$, 13.3 Mol % $B_2O_3$, 30 Mol % NiO and 30 Mol % $MnO_{1.365}$.

The Makram paper did not, however, provide sufficient information by which the nature and composition of the resulting crystals could be identified and/or verified. Neither a Curie point nor lattice constants were provided. As it is not uncommon for various crystal forms to look like other crystal forms without the provision of more objective data, there are reasons to be concerned as to whether or not the results reported were accurate with respect to the 2 to 1 manganese to nickel stoichiometry. Upon a more detailed examination of the Makram paper, several other critical problems were revealed. These problems made it impossible, even for those of extraordinary skill in this art, to reproduce the work. In fact, the inventors have never been able to exactly reproduce the Makram result.

One example of the problems caused by various disclosures within the Makram paper is that the "typical formulation" reported yields 130 Mol %; a number which is clearly impossible. Makram also required the use of an unquantified amount of an unknown formulation i.e. $MnO_{1.365}$. As a wide variety of crystalline states may result if the correct elemental ratios are not maintained, this proved to be a very troubling development. Unfortunately, there was no way to determine what actual ratios should be used based on the Makram paper.

Makram also suggested the use of $H_2O$ or air for quenching. However, the use of oxygen species could effect the chemistry of the resulting crystal. Finally, while Makram suggested that the resulting crystals had a 2 to 1 ratio of manganese to nickel, when the inventors attempted to reproduce the work, ratios of closer to about 3 to 1 were observed.

The other investigators who allegedly produced a monocrystal of nickel manganate ($NiMn_2O_4$) were V. A. M. Brabers and J. C. J. M Terhell.[5] Brabers et al. used a chemical transport method to produce various crystals. However, again, no lattice parameter was given. The ratio of manganese to nickel given for the allegedly resulting crystal was about 2.1:1. Because of the complexity of the process and its scale, the process was not considered practical.

SUMMARY OF THE INVENTION

The present invention provides monocrystalline nickel-manganese oxide having a cubic spinel geometry. In particular, the present invention provides such crystals over a full cubic spinel range of manganese to nickel ratios and lattice parameters. Monocrystals of nickel-manganese oxide are provided having a cubic spinel geometry and a molar ratio R $[R_f=(Mn/(Mn+Ni)_f]$ which ranges from between about 0.575 to about 0.810. Nickel-manganese oxide monocrystals having a cubic spinel geometry and a lattice parameter which ranges from between about 8.366 to about 8.458 Angstroms are also provided hereby.

The present invention also provides nickel-manganese oxide monocrystals having an R value of between about 0.580 and about 0.663 and a lattice parameter of between about 8.366 and about 8.399 Angstroms. In other aspects of the present invention, there are also provided a number of methods of producing nickel-manganese oxide monocrystals along the entire possible range of manganese to nickel ratios, provided that the resulting crystal has a cubic spinel geometry. Specifically, the present invention provides methods of producing a monocrystal of nickel-manganese oxide having a cubic spinel geometry and a molar ratio R which ranges from between greater than about 0.680 to about 0.807 and a lattice parameter of from 8.406 to about 8.458. Monocrystals of nickel-manganese oxide having a molar ratio R which ranges from above about 0.671 and below about 0.672 and a lattice parameter of between about 8.4026 and about 8.4030 are also contemplated. The foregoing are all ±0.003 for molar ratio R and have a 0.03% absolute average fractional error for 'a' values. In all instances, average fractional error is taken in absolute value. In particular, in accordance with the present invention, the methods involve the determination of a mixing ratio of manganese oxide and nickel oxide based empirically to a physical property of the desired crystal structure with those physical properties being, for example, X-ray density, lattice parameter or molar ratio R.

The present invention also provides various methods of producing cubic spinel monocrystals of nickel-manganese oxide from known or determined amounts of starting materials. It is also possible to predict the physical properties of the resulting monocrystal based on the proportion of $Mn_2O_3$ and NiO in the initial melt.

Finally, in accordance with the present invention unique and advantageous sensors using at least a portion of a nickel-manganese oxide monocrystal having a cubic spinet geometry as described herein are provided. Various devices which use such sensors and methods of their use are also contemplated.

By use of the methods of the present invention, one is able to produce, with a high degree of accuracy and precision, monocrystals of nickel-manganese oxide having a cubic spinel geometry and very advantageous and useful electrical properties. Because the resulting crystals are monocrystals, they do not suffer from many of the limitations and disadvantages of polycrystalline or ceramic materials, even those made from the same elements. Moreover, by the practice of the present invention, one is able to produce crystals over a broad range of manganese to nickel ratios.

Most importantly, the relationship between the starting materials useful for producing nickel-manganese oxide monocrystals and the actual crystals that will result has been determined. Therefore, it is possible to preselect a crystal based on one of its advantageous physical properties and, with a high degree of accuracy, produce crystals having that physical property.

It is also possible, in accordance with the present invention, to provide highly accurate temperature sensors or thermistors which provide significant advantages such as a high sensitivity, good reproducibility and better aging characteristics.

BRIEF DESCRIPTION OF THE DRAWINGS

FIG. 1 is a pseudo-ternary phase diagram where A is NiO, B is flux and C is $Mn_2O_3$.

DETAILED DESCRIPTION OF THE INVENTION

Figure 2:
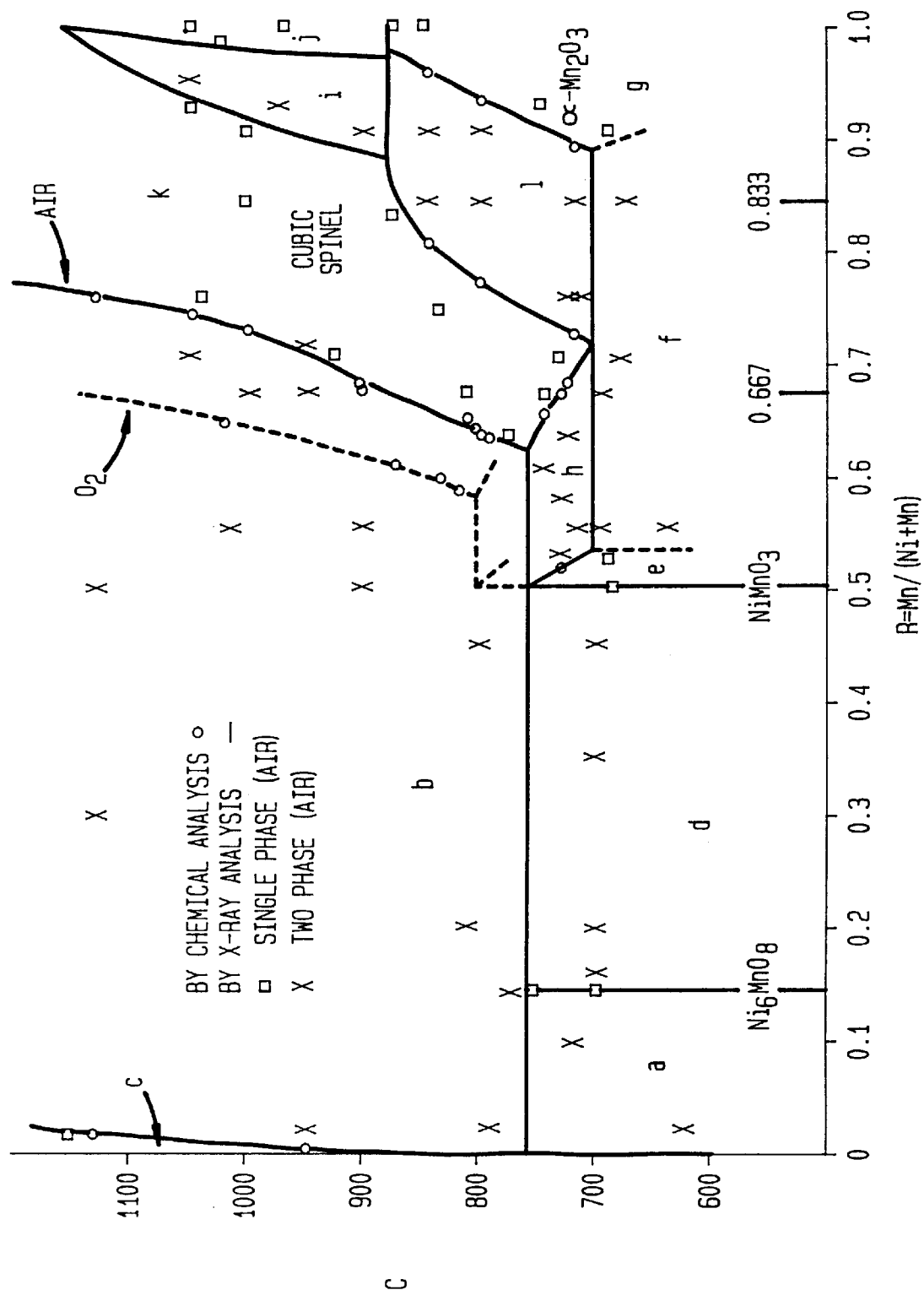
FIG. 2 is a phase diagram for the $NiO-Mn_2O_3-O_2$ system.

In accordance with the flux growth method, nickel and manganese oxides are charged, along with a $Bi_2O_3/B_2O_3$ flux into a platinum crucible. The bismuth and boron compounds are collectively referred to herein as the flux. The crucible and its contents are then placed into a furnace preferably one having a carousel or other device to insure that each crucible receives the same thermal treatment and the mixture is heated to a specific melt temperature. The mixture is then held at that melt temperature, also referred to herein as the first temperature, for a period of time sufficient to complete solution of the starting materials and, ideally, to eliminate the presence of particles which can act as seeds for uncontrolled crystal growth. This is often termed "soaking." When soaking has been completed, the material is gradually cooled to a second elevated temperature during which time crystal development and growth occurs. Within reason, the more gradual the cooling rate, the larger the resulting crystals. Finally, when the second elevated temperature has been obtained, the contents of the crucible are removed from the oven and quickly quenched to bring the material down to room temperature. Thereafter, the crystals are separated from the bismuth/boron oxide flux, cleaned and inspected.

The amounts of nickel oxide, manganese oxide, bismuth oxide and boron oxide useful in accordance with the present invention may vary depending upon a number of factors, including the size of the crystals, the desired ratio of manganese to nickel, the size of the production run and the like. However, the ratio of nickel oxide and manganese oxide in the starting melt and the relationship between the ratio of these ingredients in the starting melt and the resulting ratio of manganese and nickel in the resulting cubic spinel monocrystals is critical.

Turning to the specifics, it is generally necessary that there be an excess of nickel oxide provided in the melt mixture. However, the present inventors have discovered that above a certain amount of nickel, an inverse relationship becomes apparent between the ratio of Mn:Ni in the starting melt when compared to the Mn:Ni ratio in the resulting crystals. See FIG. 1. As the relative amount of nickel increases in the melt mixture, the relative proportion of the manganese increases in the resulting crystal. Such a relationship could not have been predicted. In fact, just the opposite was expected. The greater the increase in the amount of nickel in the melt formulation should have yielded a larger proportion of nickel relative to manganese in the resulting crystal. There are many possible explanations for this inverse relationship and, of course, many factors including solubility, melt temperature and reactivity may all be involved. Nonetheless, the data provided in FIG. 1. clearly substantiates the relationship.

In view of the foregoing, the minimum ratio of NiO to $Mn_2O_3$ in the original melt would be the one which leads to crystals which are cubic at room temperature. The maximum ratio would be the one which leads to undesirable quantities of other phases, e.g. NiO. See FIGS. 2, 3 & 11.

The amount of flux is not critical to the invention. The amount of flux must be sufficient to dissolve the other ingredients and, particularly the NiO, and should be sufficient to allow for good homogenous mixing of all of the chemical species. Sufficient flux should also be provided so as to assure complete solution at the top temperatures used. To accomplish this, at least about 60 Mol % of flux should be provided. Similarly, the melt should not be too dilute.

$B_2O_3$ in the flux may range from between about 5 Mol % to about 50 Mol %, and more preferably from about 15 Mol % to about 25 Mol % of the flux. There is a eutectic at 20 Mol % $B_2O_3$ of 622° C. This provides a good flux because it provides the lowest melting point and the greatest temperature range through which crystals may grow.

Melt temperature is an important consideration in accordance with the present invention. A preferred flux in accordance with the present invention has a eutectic temperature of about 622° C. The $Mn_2O_3$ has a melting point of about 1705° C. in air. Nickel oxide has a melting point of almost 2000° C. The boron/bismuth oxide flux acts upon the nickel oxide and $Mn_2O_3$ to depress their melting points and to hasten their dissolution.

Both the first elevated temperature (the highest temperature of the system also referred to herein as the "top temperature" or "$T_t$") and the second elevated temperature (the temperature at which quenching begins also known as the "quenching temperature" or "$T_q$") are extremely important to the growth of crystals. The top temperature must be high enough to dissolve all the components. However, the temperature cannot be so high that, for example, too much of the relatively low melting point flux evaporates.

Makram suggested that the melt should be heated to a top temperature of 1280° C. However, that temperature is by no means the upper limit for the first elevated temperature. In fact, any temperature which is suitable for a given flux and which causes the dissolution of all of the components while, at the same time, providing a relatively stable system may be utilized. Top temperatures will be limited by the volatility of the $Bi_2O_3$ which varies with the composition of the melt. Temperatures in excess of 1300° C. may be applicable for a bismuth oxide and boron oxide flux. In accordance with the present invention, this first elevated temperature may range from between about 1250° C. to about 1350° C. and preferably from between about 1260° C. to about 1300° C.

Similarly, the second elevated temperature or quenching temperature is critical to crystal formation. If $T_q$ dips below 705° C. the cubic spinel becomes unstable and other, competitive crystal phases will form in the presence of oxygen (air). (See FIG. 2)

In running a number of tests, the inventors found that for a Tq of 860° C., 2 of 3 crucibles of material were semisolid and viscous. The contents of a third crucible tested, (crucible No. 2) was substantially solid at 860° C. Crucible No. 2 was elevated again in temperature and then more rapidly cooled to a quenching temperature of 1050° C. The melt was liquid at that temperature. In general, the quenching temperature should range from between about 705° C. (the lowest temperature for the cubic spinel phase) to about 1050° C.

Crystal growth occurs during the cooling from the top temperature to the quenching temperature or until the flux freezes. If the ratios of ingredients and the temperatures are correct, then, cubic spinel single crystals of nickel-manganese oxide will result. In general, the longer that the material is allowed to cool to the quenching temperature, i.e., gradual cooling, the better. The inventors in some instances have allowed their melts to cool at a rate of approximately 1° C. per hour from 1,280° C. to 860° C.; Approximately 17½ days were required. However, to promote the growth of even larger crystals, it may be desirable to decrease the cooling rate and/or extend the cooling time. Alternatively and/or in addition thereto, the top temperature and quenching temperatures may be adjusted to provide a longer cooling period. In general, the cooling rate should range from between about 0.6 to about 5° C./hour and preferably between about 0.6 and about 1.0° C./hours.

Quenching involves rapidly lowering the temperature so as to stop crystal formation in such a way that only the crystals of the desirable structure result. To accomplish this, Makram suggested the use of air or water. However, the inventors were concerned that an abundance of oxygen during cooling may be detrimental, particularly to the surface layer of the resulting crystals. Reactions between the surface layer of the crystal and oxygen, for example, may cause localized charge variations and may change the surface chemistry of the crystals. Therefore, quenching under a blanket of, for example an anhydrous and inert gas might be highly preferably. Applicants chose to quench using an anhydrous nitrogen atmosphere.

Quenching, as well as recovery of crystals, can also be accomplished using for example, one or more screens by pouring the melt at a heated temperature of $T_q$ through such screens. Crystals of various sizes could be retained on the screens, particularly if a plurality of screens having differing mesh size are used. The mixture could also be poured into a very shallow container, like, for example, a backing sheet. Preferably, the screens or containers are heated to a few hundred degrees F. The heating of the screens and/or containers would reduce the thermal shock and stress to crystals retained on screens at ambient temperatures. The resulting crystals could be separated from the screen, or the container, and any residual flux by dissolution as described herein. Screens would preferably be made of platinum.

The process yields black crystals which may be freed from the bulk of the flux by any known means. One way to accomplish extraction is to use acids such as 10 Vol % nitric acid or 20 Vol %. acetic acid. Nitric acid reacts with the $Bi_2O_3$, when sufficient quantities are used, to form $Bi(NO_3)_3$. However, this material can react with water to produce a white insoluble precipitate $BiONO_3$. To prevent this, an excess of nitric acid, i.e. greater than 378.12 grams is required to maintain one formula weight of $Bi_2O_3$ in solution. Approximately 9 milliliters of a 10% solution of 70 weight % $HNO_3$ solution should be used to dissolve each gram of $Bi_2O_3$.

The crystals may also be removed from the crucible, broken, weighed and treated with the above described acid solution. Stirring may be used to accelerate the dissolution. If a white precipitate appears, it is assumed that $BiONO_3$ developed and additional nitric acid should be added to drive the equilibrium back towards the formation of a $Bi(NO_3)_3$/water solution.

Alternatively, a crucible can be placed into a beaker and immersed in the $HNO_3$ solution described above. Stirring of the contents should also be used. If a white precipitate occurs, additional acid should be added. The crucible is then removed from the beaker and any black crystals or other interesting materials are recovered.

If 20 volume percent (Vol %) of acetic acid is used, it may also be necessary to use an excess of acid because bismuth acetate will form during the reaction which will then undergo hydrolysis. Increasing the concentration of acetic acid will drive the reaction in such a direction so as to hold bismuth in solution. Thus up to about twice a normally calculated quantity of acetic acid may be required. For a flux containing 100 grams of $Bi_2O_3$, 738 milliliters of 20 Vol % of acetic acid may be used. As the reaction proceeds, stirring and warming will accelerate the dissolution of the flux. Other forms of acid may also be used for dissolution such as, formic acid which is slightly stronger than acetic acid. However, crystals should be inspected for possible etching. Adjustment of the acid concentration is necessary if etching occurs. Of course, various concentrations of mixed acids held above ambient temperatures can be used to hasten the dissolution process, so long as no etching occurs.

Figure 3:
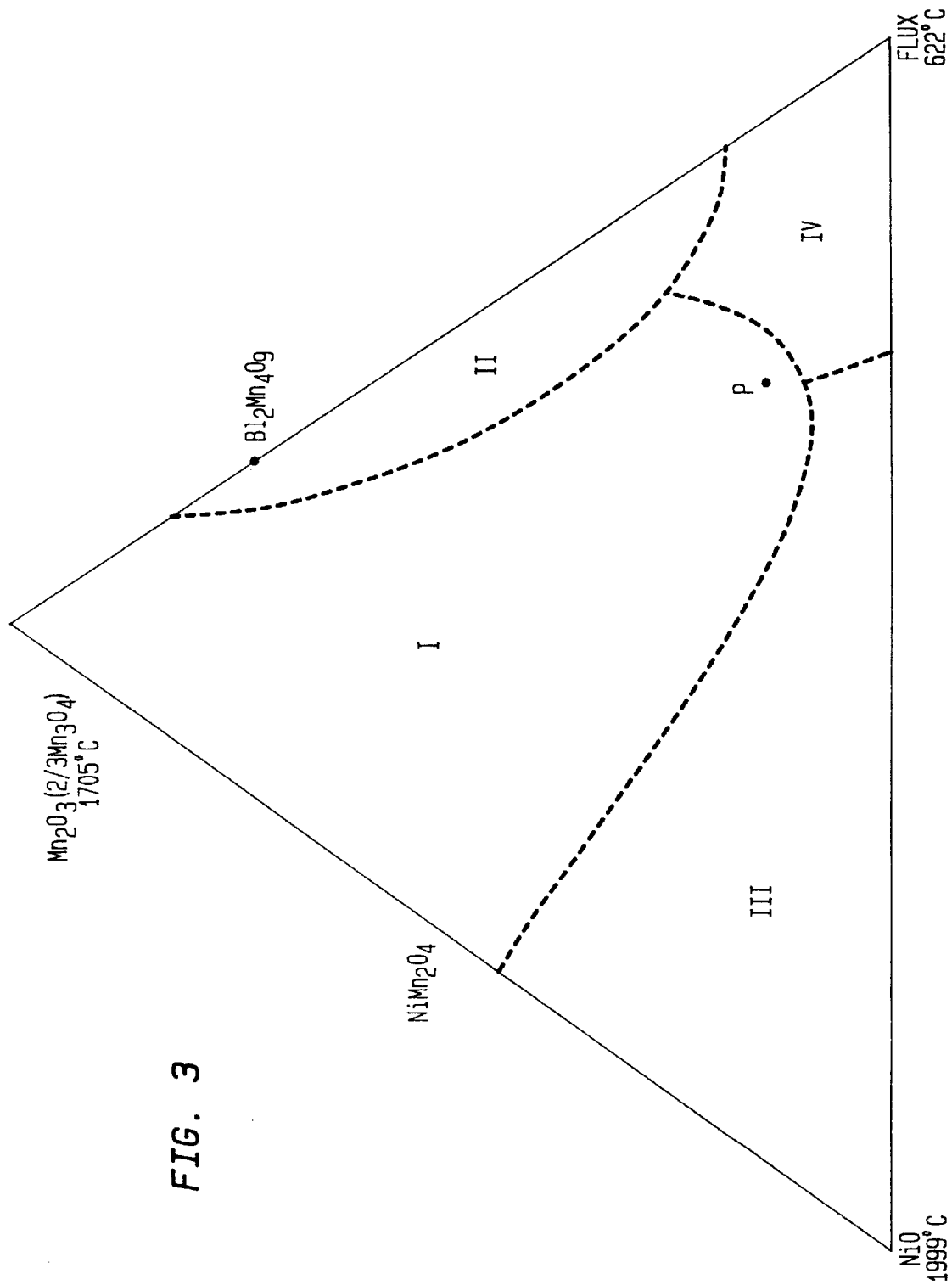
FIG. 3 is a pseudo ternary phase diagram showing the crystalline phases of various materials based upon composition.

The relationship between the type of crystal and the Mn:Ni ratio can be illustrated using the phase diagram shown in FIG. 2. FIG. 2 shows the relationship of various phases at various temperatures over the full range of compositions in the system $NiO$—$Mn_2O_3$—$O_2$ presented as the molar ratio "R" also referred to herein as the "R value". R is defined as the atomic fraction of Mn in the structure $Ni_{3(1-R)}Mn_{3R}O_4$, and which is characterized by the relation $R=Mn/(Ni+Mn)$. Although this information was generated with regard to nickel-manganese-oxide polycrystals[1], it is equally applicable in the present context. Whether or not a crystal produced in accordance with the present invention is a cubic spinel or not depends largely on the relative amounts of manganese and nickel oxides used and the melt and quench temperatures used in the flux. For example, a minimum temperature of about 705° C. is required to obtain a cubic spinel crystal of nickel-manganese oxide assuming that a proper ratio of nickel oxide and manganese oxide are used in the melt so as to result in a crystal having a molar ratio R of 0.71. It should also be clear that in order to ensure that a cubic spinel geometry is achieved, a molar ratio R for the crystal must be at least about 0.575 up to and including about 0.810 and preferably between 0.580 and 0.807.

Figure 4:
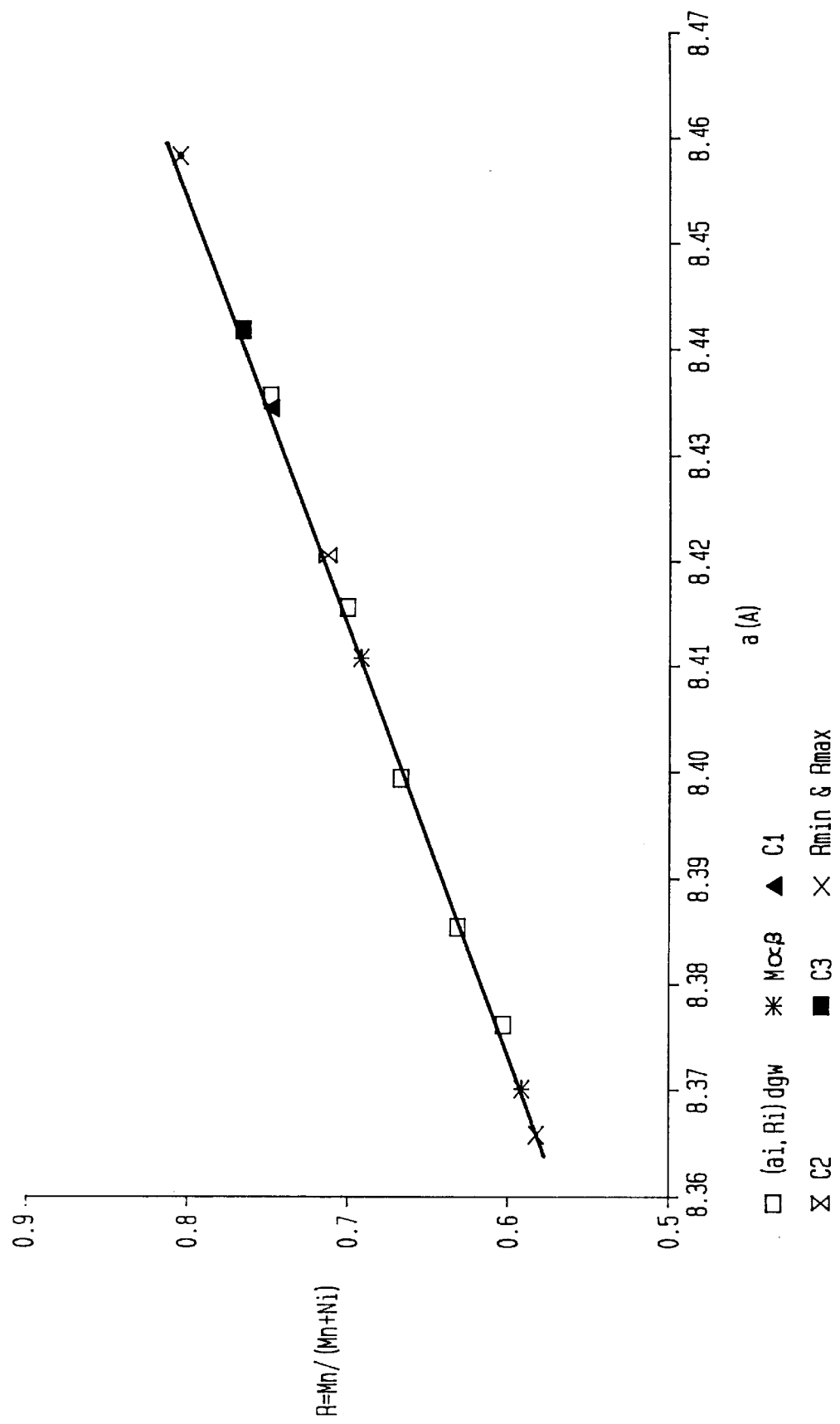
FIG. 4 is a best fit plot of molar ratio R values versus lattice parameter in Angstroms.
Figure 11:
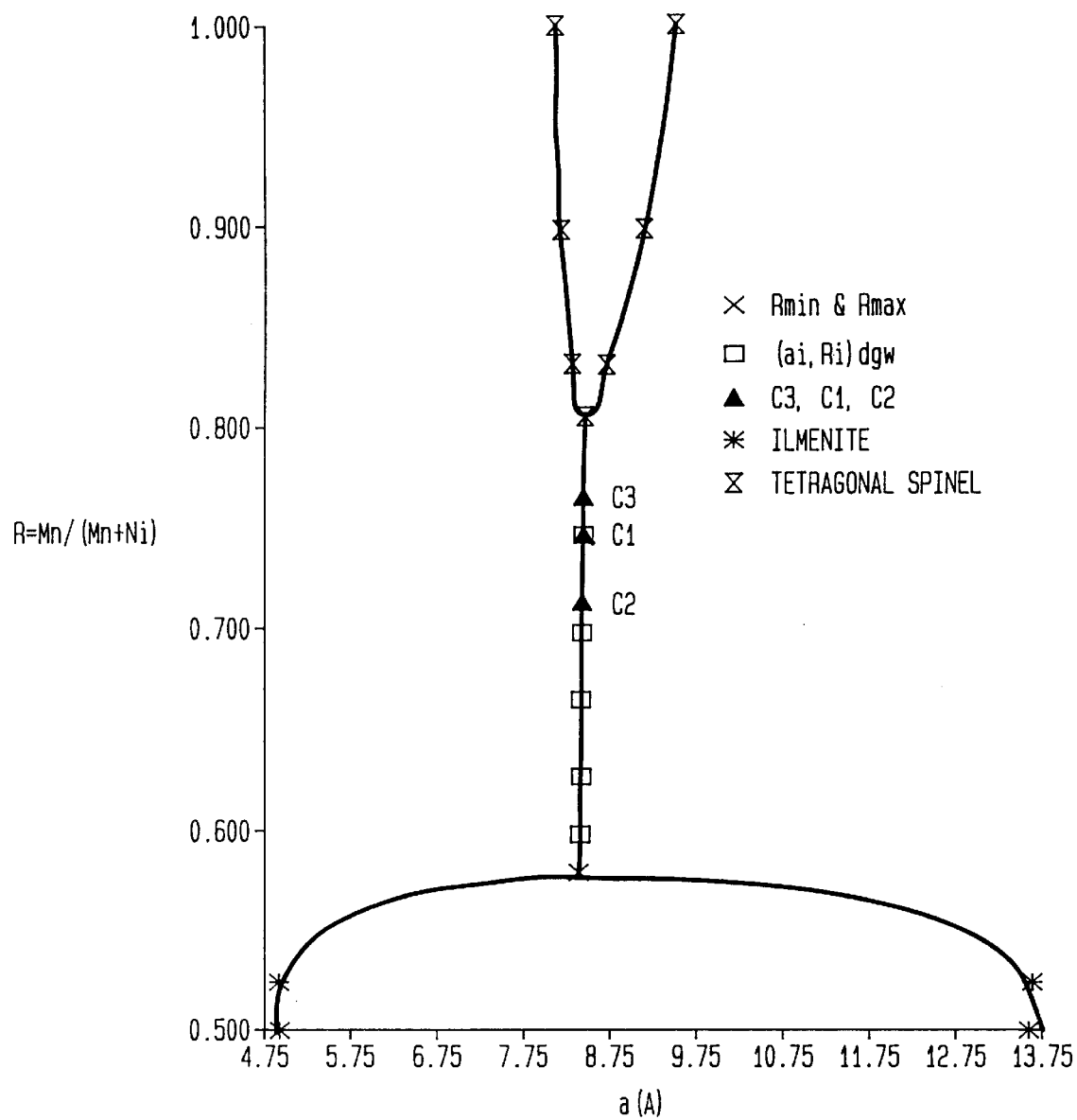
FIG. 11 is a plot of molar ratio R versus lattice parameter 'a' showing the crystalline phase transformations and the thermistor region.
Figure 12:
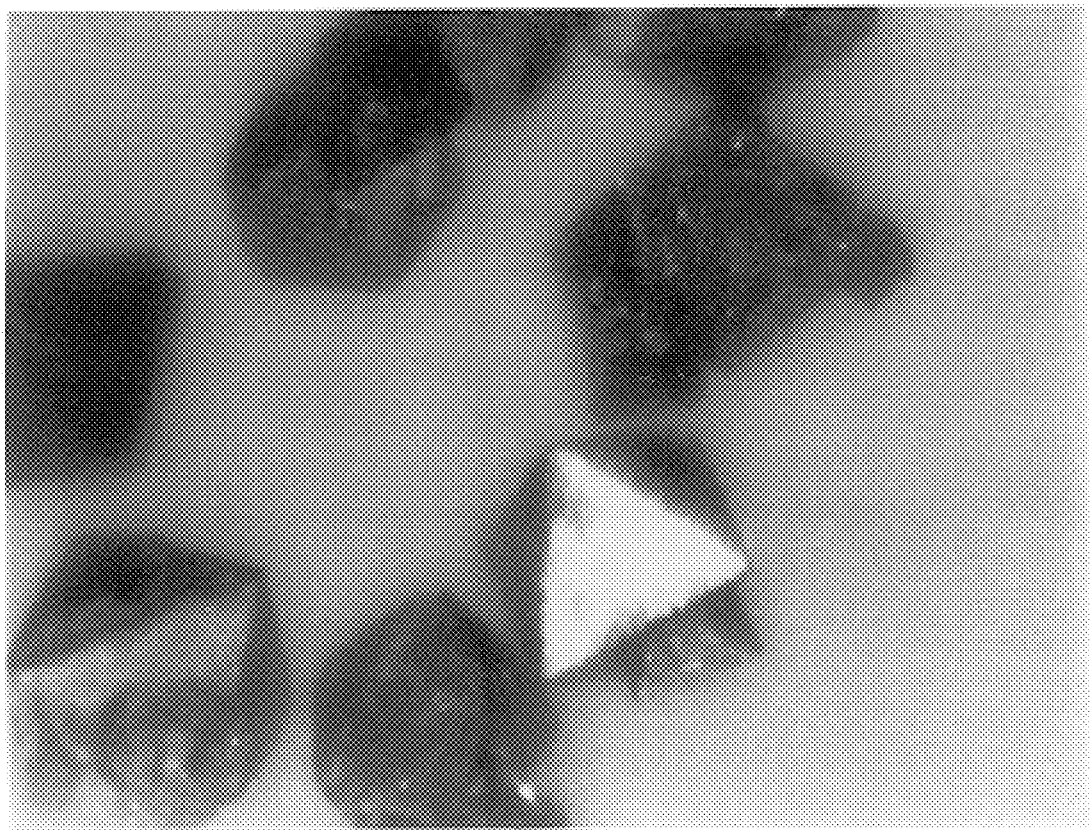
FIG. 12 is a photograph of a cubic spinel crystal with dimensions of 1.7 millimeters produced in accordance with the present invention.
Figure 14:
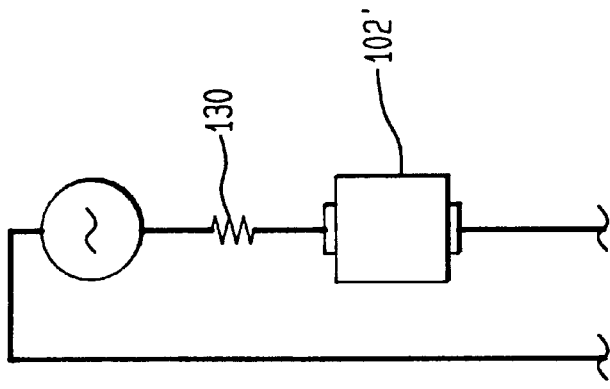
FIG. 14 is a diagrammatic view depicting an electrical circuit in accordance with the invention.

FIG. 4 illustrates a linear relationship between the molar ratio R in a crystal described above and the lattice parameter 'a' in this cubic spinel phase.[1] See also FIG. 11. The nickel-manganese oxide cubic spinel system follows Vegard's law. Thus, a change in unit cell dimension or lattice parameter 'a' should be linear with a change in R value. Lattice parameter data obtained from X-ray diffraction analysis of monocrystals produced in accordance with the present invention, all showed a cubic spinel crystal structure. These lattice parameter values are plotted in FIGS. 4 and 11 along with the previously published data.

This discovery allows one to predict the results of various ratios of starting materials or, conversely, allows one to design a melt which can provide a desired manganese to nickel ratio, molar ratio R or a specifically desired lattice parameter. It is particularly interesting to note, as will be demonstrated herein, that the ratio is not the same as that disclosed in the Makram paper. This shows that if one of ordinary skill in the art were to follow the teachings of Makram, they would not come up with a manganese to nickel ratio of exactly 2.00 or vice versa. It is the discovery of the true relationship between starting materials and the resulting cubic spinel monocrystal which is one of the central aspects of the present invention.

Specifically, the present inventors have developed an understanding of the interrelationship between the ratio of the starting melt materials and the ratio of nickel and manganese in the resulting crystals. This allows a person of ordinary skill in the art to tailor make cubic spinel crystals of nickel-manganese-oxide of any desired nickel to manganese ratio (within the boundary conditions of a cubic spinel structure) merely by varying the amounts of starting materials as indicated.

melt can be calculated based on $a^4$ or $R^4$. In this instance, the substitution of calculations based upon $a^4$ instead of $R^4$ are considered to be within the scope of the invention. Of course, slope and intercepts would need to be recalculated accordingly. Similarly, the linearity between the initial ratio of $Mn_2O_3$ to NiO in the melt and the $a^{-4}$ value of the crystal allows for the use of a similar expression in terms of $R^{-4}$.

Provided immediately below is Table 1 which is a summary of the linear equations used herein to relate the initial and final conditions for the growth of monocrystals of cubic spinel of nickel-manganese oxides from a $Bi_2O_3$—$B_2O_3$ flux. Elsewhere in the application, various values for slopes and intercepts will be reported. However, in such instances, a lessor number of significant figures may be reported.

TABLE 1

Summary of Linear Equations

| Eq | i = 1 to 6<br>Description &<br>Equation $Y_i = M_iX_i + B_i$ | i = 1 to 6<br>$M_i$<br>Slope | i = 1 to 6<br>$B_i$<br>Y intercept | i = 1 to 6<br>$r_i$<br>Linear Correlation Coefficient | Average fractional Error<br>(Experimental Error) |
|---|---|---|---|---|---|
| 1 | R vs 'a'<br>$Y_1 = (M_1X_1 + B_1)$<br>$Y_1 = R, X_1 = a$ | $M_1 = 2.48163082437$ | $B_1 = -20.1812621864$ | $r_1 = 0.99777234409$ | Ref (1) (2) |
| 2 | $R^4$ vs $(NiO)_i$<br>$Y2 = (M_2X_2 + B_2)$<br>$Y2 = (R^4), X_2 = (NiO)_i$ | $M_2 = .0121453327921$ | $B_2 = 0.497146611722$ | $r_2 = 0.999105295826$ | for R = .0945%<br>for $(NiO)_i$ = 0.15% |
| 3 | $a^4$ vs $(NiO)_i$<br>$Y_3 = M_3X_3 + B_3$<br>$Y_3 = (a^4), X_3 = (NiO)_i$ | $M_3 = 7.0739370572$ | $B_3 = 4586.55233173$ | $r3 = 0.997818697993$ | for 'a' = .01%<br>for $(NiO)_i$ = 0.23% |
| 4 | $a^{-4}$ vs $(Mn_2O_3/NiO)_i$<br>$Y_4 = M_{4x4} + B_4$<br>$Y_4 = (a^{-4})$,<br>$X_4 = (Mn_2O_3/NiO)_i$ | $M_4 = 1.22558370938 \times 10^{-5}$ | $B_4 = 1.91550818206 \times 10^{-4}$ | $r4 = 0.99082025493$ | for 'a' = .003%<br>for<br>$(Mn_2O_3/NiO)_i$ = .45% |
| 5 | $R^{-4}$ vs $(Mn_2O_3/NiO)_i$<br>$Y_5 = M_5X_5 + B_5$<br>$Y5 = (R^{-4})$,<br>$X_5 = (Mn_2O_3/NiO)_i$ | $M_5 = 5.65371512153$ | $B_5 = 0.390557459454$ | $r_5 = 0.99668151281$ | for R = .19%<br>for<br>$(Mn_2O_3/NiO)_i$ = .85% |
| 6 | D vs $(Mn_2O_3/NiO)_i$<br>$Y_6 = M_6X_6 + B_6, Y_6 = D,$<br>$X_6 = (Mn_2O_3/NiO)_i$ | $M_6 = 0.319400077862$ | $B_6 = 4.9707427375$ | $r_6 = 0.9990899688$ | for [D] = .014%<br>for 'a' = .0045%<br>for $(Mn_2O_3/NiO)_i$ = .45% |

The molar ratio R for each of the crystals resulting from each of the tests described in Example I, as well as other data provided, including data provided in the polycrystal literature,[1][2] are reported in Table 2. The molar ratio R can be calculated by the equation R=Mn/(Ni+Mn). An expression for R can also be calculated based on X, the amount of nickel replaced by manganese where R=(2+X)/3 and thus X=[3R−2]. The equivalent formula are $[Ni_{1-x}Mn_{2+x}O_4]$ and $[Ni_{3(1-R)}Mn_{3R}O_4]$. Of course, these alternative expressions, as well as other mathematical expressions of this relationship may also be used interchangeably herewith and the use of same is contemplated by the inventors.

Molar ratio R and lattice parameter 'a' in Angstroms have a linear relationship (Vegard's Law) as shown in FIGS. 4 and 11. Knowing an R value for a crystal, one can determine the lattice parameter value by reference to FIG. 4. or vise versa.

The inventors have also discovered a relationship between the composition, of the starting melt and the composition, structure and properties of the resulting crystals. In view of Vegard's law, these relationships can also be written in terms of R or 'a'. Thus, and as explained in more detail herein, the $R^4$ relationship and the $a^4$ relationship are all linear and or interchangeable. For example, the relationship between the finished crystal and the composition of the starting $(NiO)_i$

TABLE 2

Lattice Parameters and Corresponding R Values
for Nickel-Manganese-Oxide Cubic Spinel Monocrystals

| Source | a(Å) | R = Mn/(Mn + Ni) |
|---|---|---|
| R(max)** | 8.457 | .807 |
| Crucible 3 | 8.4415 | .767 |
| * | 8.435 | .750 |
| Crucible 1 | 8.434 | .749 |
| Crucible 2 | 8.424 | .724 |
| * | 8.415 | .700 |
| * | 8.399 | .667 |
| * | 8.385 | .630 |
| * | 8.376 | .600 |
| R(min)* | 8.366 | .580 |

*See Bibliographic Reference (1)
**See Bibliographic Reference (2)

In Table 2, $R_{(max)}$ indicates the maximum R value, and thus maximum molar ratio of manganese to nickel, which will yield a cubic spinel. These data are plotted in FIG. 4. $R_{(min)}$ indicates the minimum ratio of same. R=0.667 would be the value for the crystal that Makram suggested that he had created. As illustrated in FIG. 4 "C1", "C2"and "C3" represent data points associated with crucibles 1, 2 and 3 discussed in Example I. The other data points are plotted from R and 'a' values found in published references.[1][2]

The plot in FIG. 4 can also be defined mathematically from linear regression analysis[7] by the equation Y=MX+B (See Equation 1 in Table 1) where M=2.482 and B=−20.18 both to four significant figures, and where Y=R and X=a. The linear correlation coefficient is 0.998.

Estimates generated from linear regression analysis are compared to the data and referenced with respect to the data. Their absolute values are averaged and presented in percent. For example, for the lattice parameter, 'a', average fractional error is determined by ['a'(estimated)−'a'(experimental)/'a' (experimental)]. The absolute value of these fractional errors in 'a' are averaged and presented in percent. The absolute value of the average fractional error for 'a' is 0.015%. For R, the absolute value of the average fractional error is 0.48%.

Figure 5:
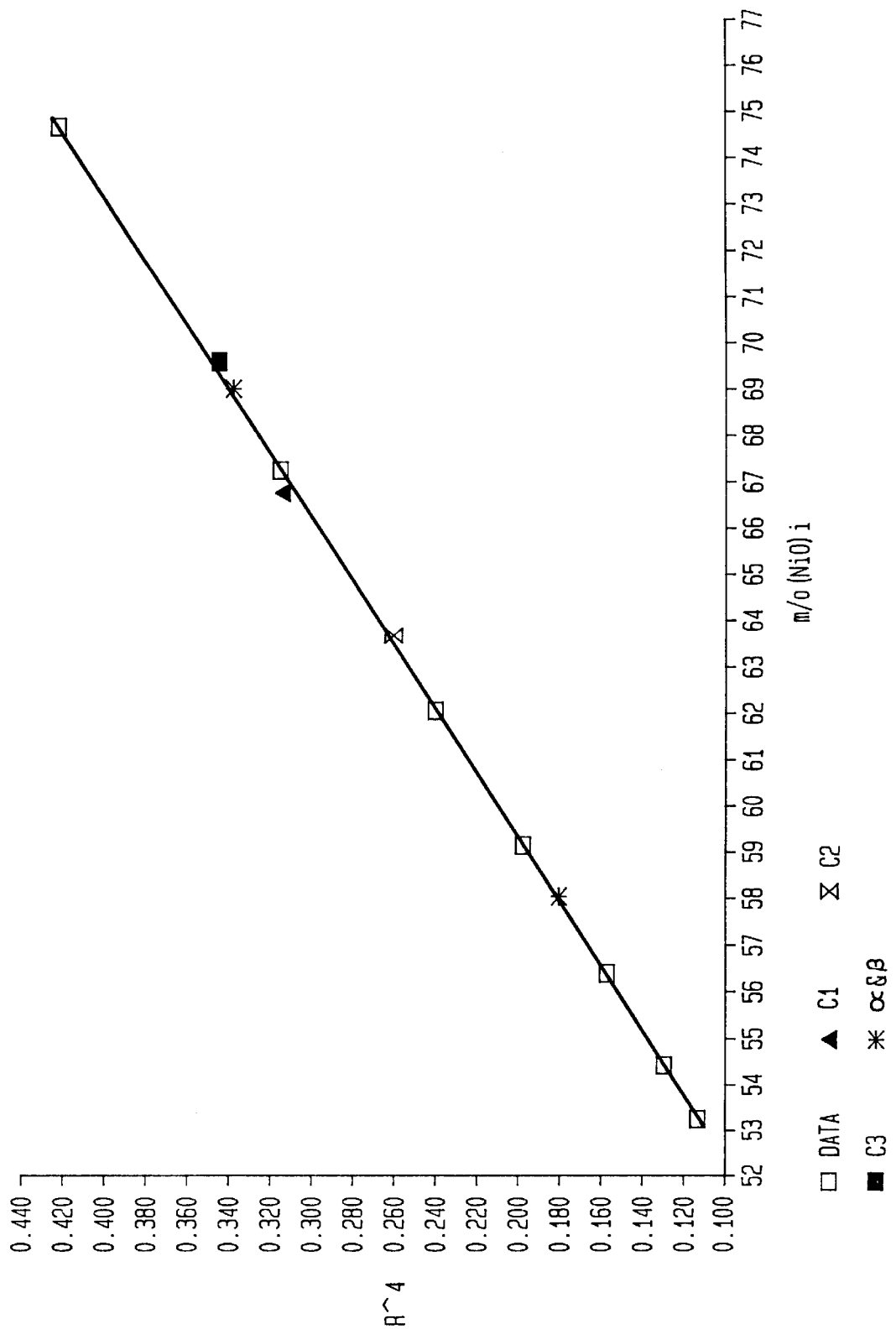
FIG. 5 is a best fit plot of $R^4$ versus the proportion of initial nickel oxide in Mol %.

The inventors have realized that there is a specific relationship between $R^4$ (R value raised to the fourth power) and the amount of nickel oxide initially needed in the melt. As shown in FIG. 5, a plot of $R^4$ versus the original nickel oxide concentration, in Mol %, yields a straight line. "C1", "C2", "C3" represent data points associated with crucibles 1, 2 and 3 discussed in Example I. The other points are calculated from R and 'a' values found in published references.[1][2] After determining the slope and intercept of the least square lines it is now possible to determine, given any R value, the amount of nickel oxide in the original melt necessary to obtain a crystal having the desired R value. Thus, assuming that the flux is not varied by a large amount, it is possible to scale the amount of nickel oxide against the amount of manganese oxide so as to provide a resulting cubic spinel crystal having any given solar ratio R or a given 'a'. Moreover, because of Vegard's law, this linear relation to $(NiO)_i$ correlates directly to the fourth power lattice parameter 'a' as well. The data points supporting the plot in FIG. 5 are shown in Table 3.

TABLE 3

$R^4$ versus $(NiO)_i$ initial.

| a (Å) | R Mn/(Mn + Ni) | $R^4$ | Data $(NiO)_i$ |
|---|---|---|---|
| Crucible 3 | 8.4415 | [.7674] | [.3469] | 69.566 |
| Crucible 1 | 8.434 | [.7488] | [.3144] | 66.675 |
| Crucible 2 | 8.424 | [.7240] | [.2748] | 63.626 |

Numbers in square brackets are reported to four significant figures.

Of course, the plot of $R^4$ versus the original nickel oxide concentration, in Mol %, in the initial melt can also be expressed using the linear relation Y=MX+B (see Equation 2 in Table 1) where M=0.01215 and B=−0.49715, both expressed to five significant figures. Again, this plot represents a best fit to the data. In fact, the relationship is accurate within a permissible amount of calculation error and/or experimental error as expressed in the correlation coefficient and in the average fractional error, (experimental error) in absolute value. Here, the linear correlation coefficient is 0.999 and the average fractional error, in absolute value, is 0.10% for molar ratio R and 0.15% for the $(NiO)_i$ values. When expressed in terms of $a^4$, (See Table 1 Equation 3), the average fractional error in absolute value, is 0.01% for 'a' and for (NiO)i is 0.24%.

Figure 6:
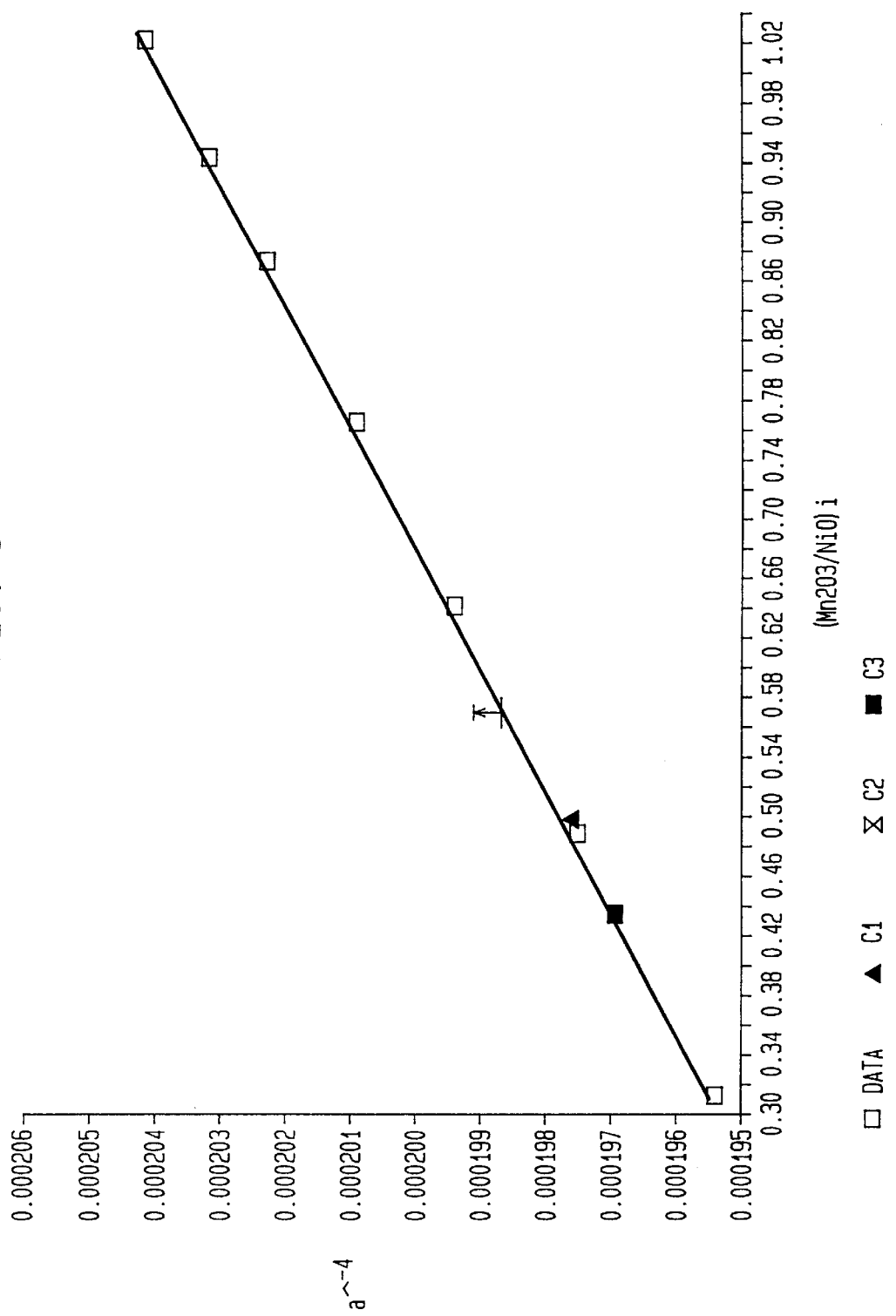
FIG. 6 is a best fit plot of $a^{-4}$ versus the molar ratio of manganese oxide and nickel oxide in the initial melt.

The inventors have also determined a way to correlate the lattice parameter 'a' (and therefore R also) with the ratio of the nickel and manganese oxides in the initial melt. The result is linear to within experimental error. See FIG. 6. In FIG. 6, "C1", "C2", and "C3" represent the data corresponding to crucibles 1, 2 and 3 in Example 1. The remaining points are calculated from R and 'a' values found in published works.[1][2] The initial molar ratio of $Mn_2O_3$ to NiO can be expressed as a linear relation of $1/a^4$ or one over the lattice parameter raised to the fourth power. The data supporting this plot is provided in Table 4.

TABLE 4

$1/a^4$ versus $(Mn_2O_3/NiO)_{initial}$

| Plot | a | $a^{-4}$ | $(Mn_2O_3/NiO)_i$ |
|---|---|---|---|
| Crucible 3 | 8.4415 | [1.9693 × 10⁻⁴] | .43748 |
| Crucible 1 | 8.434 | [1.9764 × 10⁻⁴] | .49981 |
| Crucible 2 | 8.424 | [1.9858 × 10⁻⁴] | .57166 |

Numbers presented in square brackets are to five significant figures.

When expressed in terms of a linear model, the plot shown in FIG. 6 can be expressed by the equation Y=MX+B (see Equation 4 in Table 1) where M equals 1.2256×10⁻⁵ and B=1.9155×10⁻⁴ each expressed to five significant figures. Here, the linear correlation coefficient is preferably at least about 0.999 and the experimental error or average fractional error in absolute value is 0.003% for lattice parameter 'a' and 0.45% for the molar ratio of $Mn_2O_3/NiO$ in the initial melt. When expressed in terms of $R^{-4}$, (see Table 1, Equation 5) the average absolute fractional error is 0.19% for R and 0.85% for $(Mn_2O_3/NiO)_i$.

Figure 7:
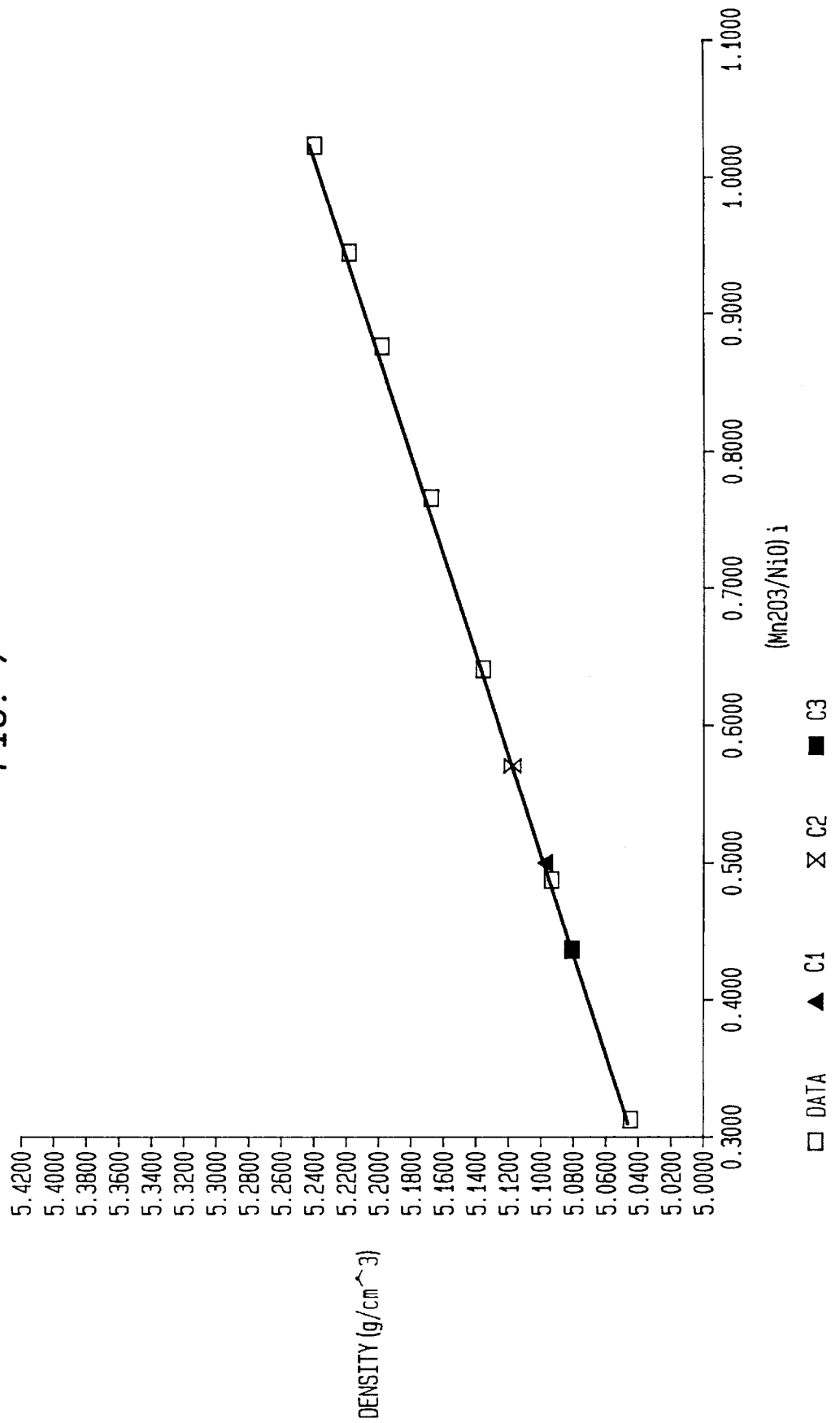
FIG. 7 is a best fit plot of the X-ray density of a unit cell versus the proportion of manganese oxide to nickel oxide in the initial melt.

With this inverse fourth order interatomic or intermolecular relationship established, the inventors considered an approximate inverse cube law for the lattice parameter combining the ratio of the mass derived from the molar ratio R, for 8 molecules packed in a unit cell to the volume of same expressed as the cube of the lattice parameter. This presents the data in an X-ray density form. FIG. 7 is a plot of X-ray density versus the initial molar ratio of $Mn_2O_3$ to NiO in the melt. Points derived from crucibles 1 and 3 were connected to yield a straight line and the third point, from crucible 2 was very close to that line and was within experimental error. ("C1", "C3" and "C2" represent data points associated with crucibles 1, 3 and 2 respectively and the remaining points were calculated from R and 'a' values in published works.[1][2])

The X-ray density was computed from the following information: a cubic spinel has a chemical formula $AB_2O_4$. The unit cell contains 8 "molecules" and may thus be written as $8(AB_2O_4)$ or $A_8B_{16}O_{32}$. The volume of the unit cell is a The weight of the unit cell consists of 8 times the molecular weight of $AB_2O_4$ or, in this case, $A_{(3(1-R))}B_{3R}O_4$. The density of the unit cell is the ratio of its mass to volume. The density of a flawless monocrystal is the density of the unit cell.

Having determined the lattice parameter of the unit cell of the cubic spinel by X-ray diffraction, this derivation can be called the X-ray density and given by the following equation: $D[g/cm^3]=[nA(AMU)]/[N(AMU/g)]/[V(cm^3)]$, wherein n=the number of "molecules" per unit cell (8 in this case), A=the sum of the atomic weights of the "molecule" expressed in atomic mass units (AMU), N=6.0220×10²³ (AMU/q) (Avogadro's number), and V=the volume of the unit cell given by the third power of the lattice parameter in cubic centimeters.

As shown in FIG. 7, the density of the unit cell can be plotted against the initial molar ratio of manganese oxide to nickel oxide. The formula for the resulting regression line, $D=0.31940(K_3O_3/NiO)_i+4.9708$ to five-significant figures, has a linear correlation coefficient of 0.999. The average fractional error for the lattice parameter is 0.005%, for D is 0.014 and for $(Mn_2O_3/NiO)_i$ is 0.45%. (See Table 5) Using density values calculated from (a, R) data from previous published works,[1] one can calculate the required ratio of starting materials in the melt from this linear model to obtain cubic spinel monocrystals having these (a, R) characteristics.

not consistent with the relationship identified herein. In fact, to obtain a crystal having a manganese to nickel ratio of 2:1 in the final crystal, the ratio of manganese oxide to nickel oxide in the initial melt would have to be 0.7926:1 based on an R of 0.667.

Of course, the relationship between the ratio of the starting materials and the resulting crystals can also be expressed mathematically by reference to $R^4$ or $a^4$ versus the proportion of NiO in the starting melt and ($R^{-4}$, $a^{-4}$ or D)

TABLE 5

Density of Cubic Spinel versus $(Mn_2O_3/NiO_i)$

|  | R | a (Å) | $(Mn_2O_3/NiO)_i$ | $Ni_{3(1-3R)}Mn_{3R}O_4$ | Molecular Weight | Formula Weight of Unit cell | Calculated Density |
|---|---|---|---|---|---|---|---|
| Crucible 3 | [.76742] | 8.4415 | .43748 | $[Ni_{.6977}Mn_{2.3023}O_4]$ | [231.43] | [1851.4] | [5.0110] |
| Crucible 1 | [.74881] | 8.434 | .49981 | $[Ni_{.7536}Mn_{2.2464}O_4]$ | [231.64] | [1853.1] | [5.1293] |
| Crucible 2 | [.72400] | 8.424 | .57166 | $[Ni_{.8280}Mn_{2.1720}O_4]$ | [231.92] | [1855.3] | [5.1538] |

*See published data[1]
**See published data[2]
Numbers shown in square brackets are to five significant figures.

The foregoing underscores the fallacy of the Makram paper. Neither R value nor "a" value were provided in the Makram paper. Therefore, it was impossible to determine, without having done the entire range of experiments conducted by the inventors, whether or not, in fact, the relationship Makram suggested, namely a 2:1 manganese to nickel ratio in a crystal actually resulted in fact, now it id clear that using the amounts of starting materials suggested by Makram in his paper, normalized or otherwise, the result would not be the crystal he suggested, but in fact would be a crystal having a greater than 2 to 1 ratio of manganese oxide to nickel oxide.

Based on the foregoing it is also possible to merely charge predefined amounts of starting materials into a heating vessel and produce a monocrystal of nickel-manganese oxide having a cubic spinal geometry. Moreover, within experimental error it is possible to predict with some relative certainty the physical properties of the resulting crystal. Specifically, the ratio of $Mn_2O_3/NiO$ in the initial melt can range from about 1.267:1 to about 0.3332:1 and the result will, it done right, be a cubic spinal of nickel-manganese oxide wherein the resulting crystal will have an R value ranging from between $R_{(min)}$ and $R_{(max)}$, respectively. Similarly, the lattice parameter for the resulting crystals at either end of the range of cubic spinal is from about 8.366 to about 8.458 Angstroms, respectively. Any initial ratio of nickel oxide and manganese oxide falling within the range cited herein will provide a cubic spinel crystal.

Again, the relationship between the starting materials and the properties and structure of the resulting crystals are one of the central focuses of the present invention. However, from the foregoing, the relationship between the starting materials and the properties of the resulting crystals can be determined. For example, it has been determined that the ratio of $Mn_2O_3/NiO$ in the initial melt can be related to the lattice parameter in the resulting crystal through a $1/a^4$ relationship. From this number, the lattice parameter 'a' and, the R value of the resulting crystal, is can be determined. It is significant to note, however that if the supposed amount of starting material disclosed in the Makram paper were utilized in producing a crystal (as attempted in crucible 1 in the Example I), the result would not be a crystal having a manganese to nickel ratio of 2:1. Thus, Makram's result is versus the ratio of an $Mn_2O_3/NiO$ in the starting melt. Other mathematical expressions may be used as well.

Figure 13:
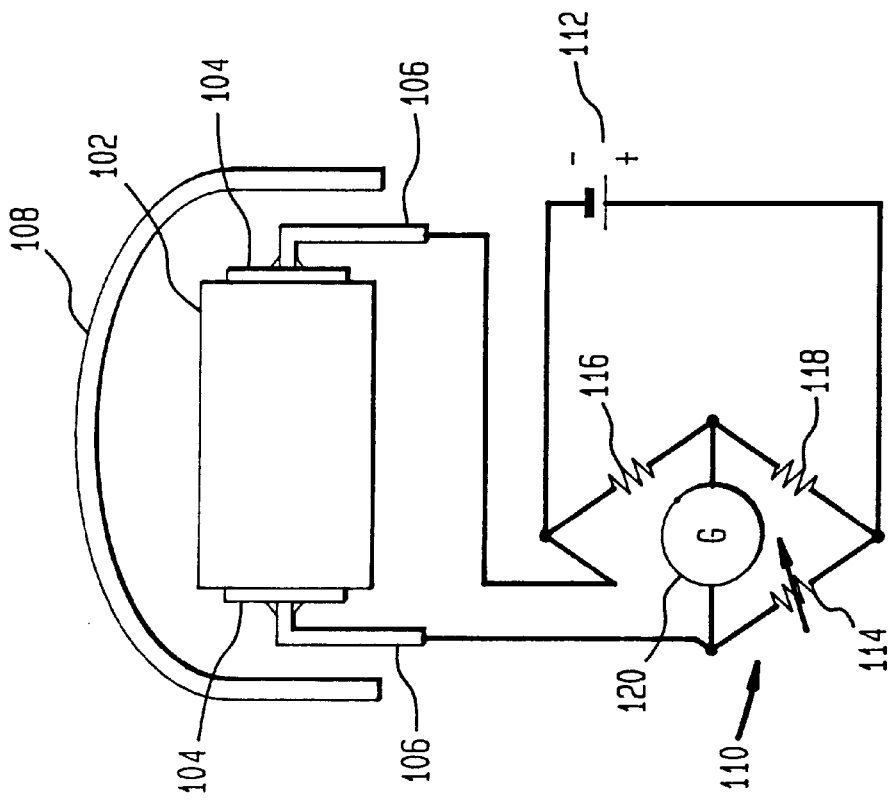
FIG. 13 is a diagrammatic view depicting a sensor in accordance with an embodiment of the invention.

A sensor in accordance with a further embodiment of the invention includes a sensing element 102 (FIG. 13) consisting of a monocrystalline nickel-manganese oxide spinel made in accordance with the above-described embodiments of the invention, and a pair of electrical terminals 104 in substantially ohmic contact with the sensing element. Terminals 104 can be formed from noble metals and their alloys, copper, and aluminum and their alloys. Platinum, palladium and gold, and their alloys are particularly preferred. The metallic terminals can be applied by sputtering the metal of the terminal onto the spinel, or by electroplating, electroless plating, painting with a metallic paint or pressurized contact so that the metal of the terminal is in intimate contact with the spinel. Leads 106 are connected to the terminals by welding. Sensing element 102, contacts 104 and leads 106 are enclosed in a conventional housing 108, of which only a portion is illustrated in FIG. 13.

Leads 106, and hence the sensing element, are connected to an electrical resistance measuring device 110 adapted to measure the electrical resistance through the sensing element. The particular resistance-measuring device illustrated in FIG. 13 is a Wheatstone bridge, incorporating a battery 112; a variable resistor 114 in series with the sensing element to form one branch; resistors 116 and 118 connected in series with one another to form another branch in parallel with the first branch and a galvanometer 120 connected between the branches. The circuit can be used to measure an unknown temperature by exposing the housing 108, and hence sensing element 102, to the unknown temperature, and adjusting resistor 114 until the bridge is in balance, whereupon galvanometer 120 shows no current flow. The resistance required to bring the bridge into balance is a measure of the resistance through the sensing element, and hence a measure of the unknown temperature. Many other conventional resistance-measuring instruments can be used in place of the Wheatstone bridge. For example, a conventional ohmmeter can be employed.

The sensing element can also be used to provide temperature compensation in an electrical circuit. For example, an electronic circuit may include resistor 130 connected in series with sensing element 102' similar to the sensing element discussed above, and further connected to other circuit components (not shown). When the circuit is exposed to changes in ambient temperature, the resistance of resistor 130 tends to increase with increasing temperature. The decrease in resistance of sensing element 102' compensates for such increase. The variation in impedance of the sensing element with temperature can be used to compensate for changes in properties of other electronic components, such as semiconductors, capacitors, inductors and the like. Sensing elements according to this aspect of the invention are particularly useful in circuits driven with alternating currents above about 10 Hz, and even more useful at higher frequencies. In contrast to polycrystalline sensors, the sensors according to this aspect of the invention have substantially lower dispersion or change in impedance with frequency than polycrystalline sensing elements. See generally the 1993 Thermometrics' Catalog, entitled "Worldwide Capability in Thermistors". The text of which is also incorporated by reference. Thermistors can operate between at least −63 to 260° C. A wider range will be available with doping.

The foregoing will be better understood with reference to the following examples. All references made to these examples are for the purposes of illustration. They are not to be considered limiting as to the scope and nature of the present invention.

EXAMPLE I

Monocrystals of nickel-manganese oxide having a cubic spinel geometry were grown in solutions of molten mixtures of bismuth and boron oxides (flux) as follows. Three compositions were studied as shown in Table 6.

TABLE 6

Initial Melt Compositions

| Crucible | $B_2O_3$* | $Bi_2O_3$* | NiO* | $Mn_2O_3$* |
|---|---|---|---|---|
| 1. | 11.57 | 49.30 | 26.09 | 13.04 |
| 2. | 11.67 | 49.74 | 24.56 | 14.04 |
| 3. | 11.47 | 48.88 | 27.59 | 12.07 |

All reported to 4 significant figures.
*Mol %

In a first platinum crucible (2.4 inches in dia., 2.75 inches in height) having a volume of about 200 ml was placed 27.53 grams $B_2O_3$, 785.66 grams $Bi_2O_3$, 63.63 grams NiO and 70.42 grams $Mn_2O_3$. In the second platinum crucible, of the same dimensions as the first, 27.53 grams $B_2O_3$, 785.25 grams $Bi_2O_3$, 62.16 grams NiO and 75.08 grams $Mn_2O_3$ were placed. In a third crucible, which was identical, to crucibles 1 and 2, 27.53 grams of $B_2O_3$, 785.66 grams $Bi_2O_3$, 71.08 grams NiO and 65.73 grams $Mn_2O_3$ were charged. An equilibrium between the material in the crucible and the oxygen in the atmosphere was established so the crucible should not be tightly covered. The crucibles were each placed into a furnace and heated to a top temperature of 1,280° C. and were soaked at that temperature for 60 hours. The crucibles were disposed within a carousel which rotated slowly (about 30 RPM) to ensure that each crucible received the same thermal treatment. After 60 hours of soaking, the crucibles were then cooled to a second elevated temperature of 860° C. at a rate of 1° C. per hour.

The contents of crucibles 1 and 3 were semi-solid and viscous. The contents of crucible 2 appeared to be substantially all solid. After the three crucibles were quenched to ambient temperatures, crucible 2 was reheated to a temperature of 1,280° C., soaked for about 60 hours and cooled at a rate of 5° C. per hour to a temperature of 1,050° C. The material was then quenched by pouring onto a stainless steel screen over a metal container filled with sand and cooled under nitrogen gas to ambient temperature. The monocrystals in crucibles 2 and 3 were recovered by treatment with nitric acid as described. The monocrystals from crucible 1 were recovered using nitric acid followed by acetic acid.

The contents of crucibles 1 and 3 were cored to provide a cylindrical core which was approximately ½ inch in diameter by 2 inches in length. The cores were then broken, treated with acid as described, the residual solids washed and filtered and the crystals recovered.

As shown in Table 7, each individual crucible was charged with a composition including a specified amount of nickel oxide, manganese oxide and flux. The amounts of these individual materials are shown in column 2. See also table 6. Column 3 of Table 7 reports the initial amounts of nickel oxide and manganese oxide in Mol %. Column 4 contains the experimentally obtained lattice parameters 'a' from the X-ray diffraction pattern of the crystals resulting from the three crucibles. As will be readily apparent, the resulting lattice parameters indicate that the crystals produced are cubic spinel within a=b=c geometry.

TABLE 7

Characterization of Nickel-Manganese-Oxide Monocrystals Having a Cubic Spinel Geometry Produced in Example I

| Crucible | Melt materials (Mol %) | | | $(NiO)_i$, $(Mn_2O_3)_i$ (Mol %) | Lattice parameter 'a' Å | R | (Mn/Ni) final 3R/3(1−3R) | Formula $Ni_{3(1-R)}Mn_{3R}O_4$ | $(NiO)_f$ and $(Mn_2O_3)_f$ (Mol %) | Flux (Mol %) |
|---|---|---|---|---|---|---|---|---|---|---|
| | NiO | $Mn_2O_3$ | Flux | | | | | | | |
| 3 | 27.59 | 12.07 | 60.35 | 69.566, 30.434 | 8.4415Å | [.767424] | [3.2997] | [$Ni_{.6977}Mn_{2.3023}O_4$] | $(NiO)_f =$ [37.738] $(Mn_2O_3)_f =$ [62.262] | $(B_2O_3)_i =$ [19.01] $(Bi_2O_3)_i =$ [80.99] |
| | $\frac{Mn_2O_3}{NiO} = \frac{12.07}{27.59} = .4375$ | | | | | | | | | |
| 1 | 26.09 | 13.04 | 60.87 | 66.675, 33.325 | 8.434Å | [.748812] | [2.9811] | [$Ni_{.7536}Mn_{2.2464}O_4$] | $(NiO)_f =$ [40.152] $(Mn_2O_3)_f =$ [59.848] | $(B_2O_3)_i =$ [19.01] $(Bi_2O_3)_i =$ [80.99] |

TABLE 7-continued

Characterization of Nickel-Manganese-Oxide Monocrystals
Having a Cubic Spinel Geometry Produced in Example I

| Crucible | Melt materials (Mol %) | | | $(NiO)_i$, $(Mn_2O_3)_i$ (Mol %) | Lattice parameter 'a' Å | R | (Mn/Ni) final 3R/3(1–3R) | Formula $Ni_{3(1-R)}Mn_{3R}O_4$ | $(NiO)_f$ and $(Mn_2O_3)_f$ (Mol %) | Flux (Mol %) |
|---|---|---|---|---|---|---|---|---|---|---|
| | NiO | $Mn_2O_3$ | Flux | | | | | | | |
| 2 | 24.56 | 14.04 | 61.41 | 63.626, 36.373 | 8.424Å | [.723996] | [2.6231] | $[Ni_{.8280}Mn_{2.1720}O_4]$ | $(NiO)_f$ = [43.261] $(Mn_2O_3)_f$ = [56.739] | $(B_2O_3)_i$ = [19.00] $(Bi_2O_3)_i$ = [81.00] |

Significant figures are indicated by square brackets.

Returning to Table 7, Column 5 reports the molar ratio R values for crystals in each crucible and Column 6 indicates the ratio of manganese to nickel in the resulting crystals. Similarly, Column 7 reports the formula of the resulting cubic spinel crystal. Column 8 shows the actual amounts, in mole percent, of $Mn_2O_3$ and NiO in the crystals. Column 9 includes the Molt percent of boron oxide and bismuth oxide relative to the flux used in each experiment described in Example I.

The ratio of manganese to nickel in the crystals in crucible 1 was determined to be 2.9811 indicating almost three times as much manganese as nickel. The ratio of manganese to nickel in the crystals of crucible 2 was determined to be 2.6231, i.e. the closest to that expected based on the Makram paper. Crucible 3 produced crystals having a ratio of manganese to nickel of 3.2997.

Also shown in FIG. 1, the relative proportions of NiO to $Mn_2O_3$ corresponding to the formula $Ni_{1-x}Mn_{2+x}O_4$ can be calculated and plotted. The results of crucible 1 was 59.848 Mol % $Mn_2O_3$ and 40.152 Mol % NiO. The lattice parameter (a=b=c) was 8.434 Angstroms and the molar ratio R was 0.749. This corresponded to a formula of $Ni_{0.7536}Mn_{2.2464}O_4$ and a manganese to nickel ratio of 2.9811. This formulation was intended to reproduce the Makram paper. All of the above are rounded to the number of significant figures shown.

The crystals formed in crucible 2 were 56.739 Mol % $Mn_2O_3$ and 43.261 Mol % NiO. The lattice parameter was 8.424 Angstroms and the molar ratio R was 0.724. This corresponded to a formula of $Ni_{0.8280}Mn_{2.1720}O_4$ and a manganese nickel ratio of 2.6231. Finally crucible 3 yielded crystals of 62.262 Mol % $Mn_2O_3$ and 37.738 Mol % NiO having a lattice parameter of 8.4415 Angstroms and an R value of 0.767. This corresponded to a formulation having $Ni_{0.6977}Mn_{2.3023}O_4$ and a manganese to nickel ratio of 3.2997. Again, all of these numbers are rounded to the indicated number of significant figures.

As can be seen in FIG. 1, when plotted in terms of their respective proportions of nickel oxide and manganese oxide in the melt and in the resulting crystal, the crystals from crucible 3 contained the lowest percentage of nickel oxide while those of crucible 2 contained the highest. This is particularly interesting since crucible 3 contained the highest initial percentage of nickel oxide in the starting melt and crucible 2 contained the lowest melt percent thereof. This is also illustrated by the points within the graph of FIG. 1 illustrating the starting concentrations of nickel oxide, $Mn_2O_3$ and flux. It has been found that an inversion takes place. This relationship could not have been predicted based on any of the prior art known to the inventors. In fact, it was totally unexpected.

What is also surprising is that, in accordance with the Makram paper, crucible 1 should have yielded a crystal along line AC at the midpoint in FIG. 1. Moreover, it would have been expected that crucible 2 would have yielded a crystal having a relatively higher percentage of manganese, thereby being plotted on line AC above the midpoint of line AC while crucible 3 should have provided a crystal having a lower concentration of manganese and therefore, been plotted below the midpoint of line AC. Not only were all three of the data points located above the midpoint of line AC, but moreover, due to the aforementioned inversion, the results for crucible 3 yielded a crystal having a relatively lower percentage of nickel oxide than crucible 2.

EXAMPLE II

Sensors developed from the materials grown in crucible 1 were used to determine the change in resistance of the material at various temperatures. Those sensors were produced as follows. Monocrystals are recovered from the frozen flux by an acid dissolution process (as previously described) and cleaned by tumbling with fine table salt (NaCl). The crystals were then recovered by dissolving the salt in hot water. Electrical contacts are made by applying a dab of [Pd—Ag] ink to a single facet of a cleaned and dried monocrystal. The monocrystal is then fired in the hot zone of a tube furnace at 825° C. After a dwelling time of 10 minutes, the monocrystal was removed from the furnace and allowed to cool. A second dab of [Pd—Ag] ink was then applied to a second facet of the monocrystal and fired as before.

When the crystal was again cooled, two 1.1 mil Pt wires were positioned over the fired ink spots by stringing them in a fixture that applies tension to the wires and keeps them parallel to each other. A small dot of [Pd—Ag] ink was then applied over the Pt wires to the previously fired ink spots. The monocrystal, the Pt wires and the fixture were then all fired in the tube furnace as previously described. The two 1.1 mil Pt wire leads were cut short and were welded to an individual 4 mil Pt wire. In so doing, the free end of the 1.1 mil leads are cut very close to the monocrystal. The resulting assembly was positioned inside a glass cylinder with the two 4 mil Pt wires extending from the inside to the outside of the cylinder. This embedded 4 mil lead configuration was again fired in the tube furnace. The result is a hermetically sealed monocrystal in glass with the 4 mil lead wires available for electrical measurement.

Figure 8:
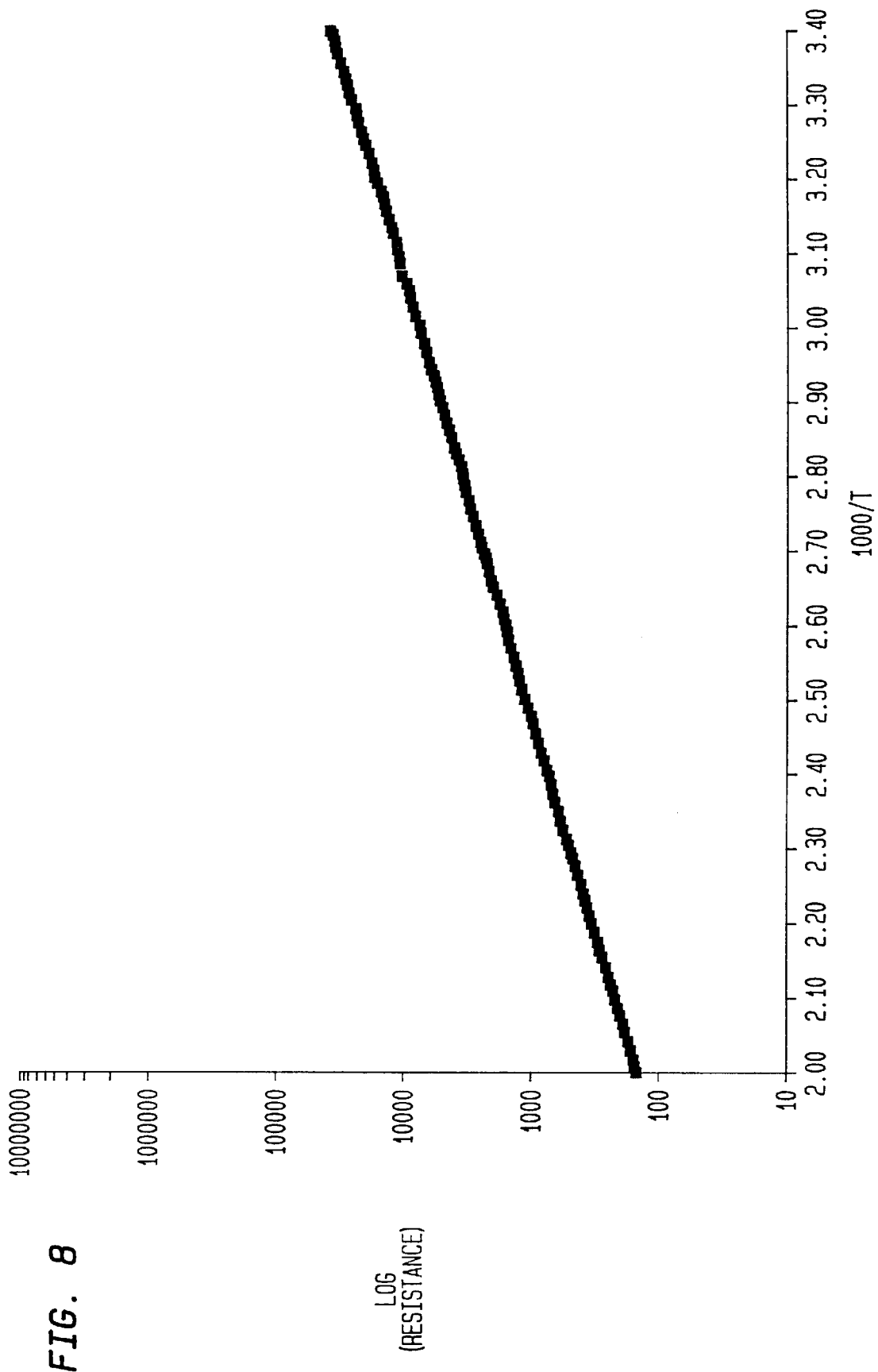
FIG. 8 is a plot of the log of resistance of crystals produced in accordance with the present invention versus reciprocal temperature.
Figure 9:
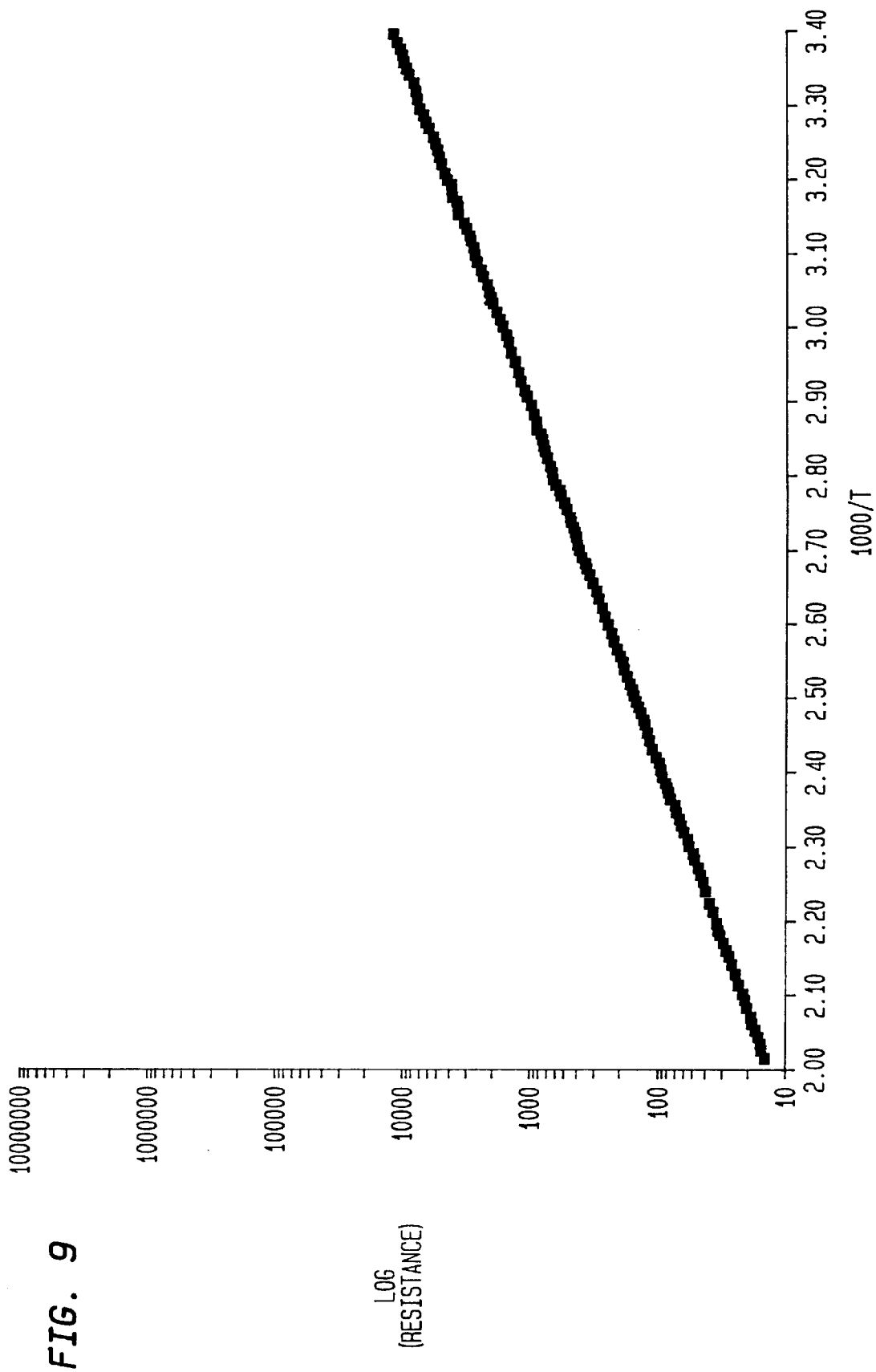
FIG. 9 is a plot of the log of resistance of crystals produced in accordance with the present invention versus reciprocal temperature.
Figure 10:
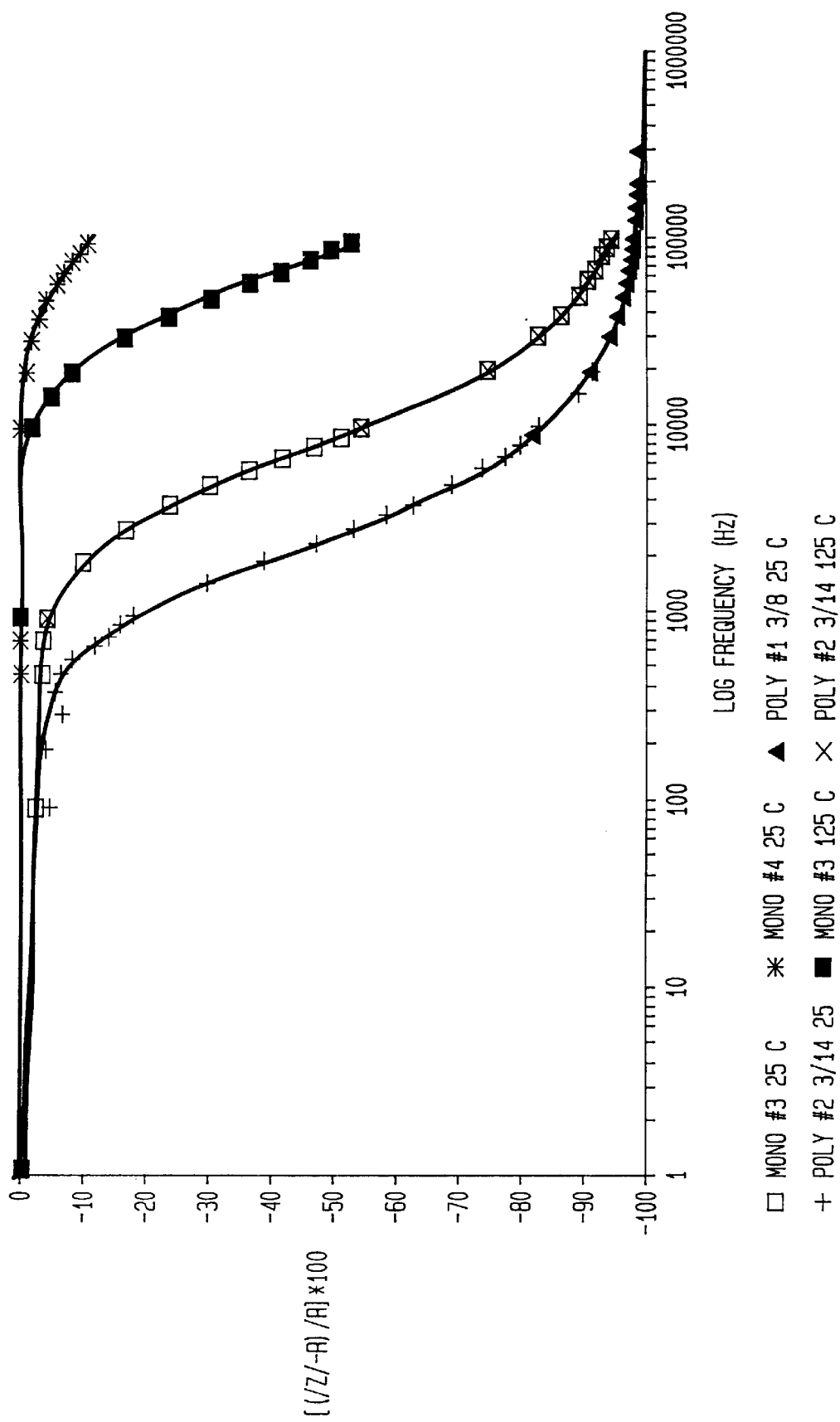
FIG. 10 presents the normalized dispersion relations of the impedance for the cubic spinel crystals to audio frequencies for two isotherms.

As shown in FIGS. 8 and 9, temperature (T in degrees Kelvin) is plotted as 1000/T from approximately 260° C. at the far left to approximately 0° C. at the far right. The log of the resistance at those temperatures shows good linearity across the entire 260° C. range and demonstrates that discrete resistance values are obtained at each temperature point. Table 8 shows that the observed DC resistance curve matches quite well with the mathematical model for polycrystalline thermistor resistance—temperature characteristics.

TABLE 8

T = T(C) + 273.15K SPECIMEN #3 Crucible 1
R = exp($A_o$ + A1/T + A2/$T^2$ + A3/$T^3$)
A0 = −2.668689864071D + 00
A1 = +3.393234481945D + 03
A2 = +3.131004219043D + 05
A3 = −5.044024209058D + 07

| CALIBRATION TEMPERATURE DEG. C. | CALIBRATION RESISTANCE OHMS | COMPUTED RESISTANCE OHMS | TEMPERATURE ERROR DEG. C. |
|---|---|---|---|
| 37.00000 | 18692.00000 | 18697.97806 | −0.00801 |
| 50.00000 | 11340.00000 | 11331.80580 | 0.01945 |
| 70.00000 | 5597.00000 | 5599.67243 | −0.01429 |
| 170.00000 | 404.80000 | 404.69675 | 0.01241 |
| 190.00000 | 273.00000 | 273.04937 | −0.00960 |

The importance of these results cannot be emphasized enough. As FIGS. 8 and 9 illustrate, the slope of curve log R (Resistance in this case) versus reciprocal temperature shows the characteristic negative temperature coefficient (NTC) properties of a thermistor. The data which corresponds to FIGS. 8 and 9, each generated using one crystal from crucible 1, is presented in Table 9.

TABLE 9

DC Resistance as a Function of Temperature from (0 to 260)° C.

| T (° C.) | Crucible 1 Crystal #3 [Kohms] | Curve Fit | Crucible 1 Crystal #4 [Kohms] | Curve Fit |
|---|---|---|---|---|
| 0 | 98.26 | 96.31 | 100.6 | 99.29 |
| 25 | 30.73 | 30.68 | 30.85 | 30.81 |
| 37 | 18.692 | 18.698 | 18.568 | 18.568 |
| 50 | 11.340 | 11.332 | 11.123 | 11.123 |
| 70 | 5.597 | 5.600 | 5.406 | 5.406 |
| 125 | 1.136 | 1.130 | 1.054 | 1.049 |
| 170 | 0.4048 | 0.4047 | 0.3659 | 0.3659 |
| 180 | 0.3309 | 0.3310 | 0.2975 | 0.2977 |
| 190 | 0.2730 | 0.2731 | 0.2443 | 0.2443 |
| 200 | 0.2266 | 0.2271 | 0.2022 | 0.2022 |
| 243 | 0.1102 | 0.1115 | 0.0972 | 0.0973 |
| 260 | 0.08565 | 0.08688 | 0.07537 | 0.0753 |
| (1) | (2) | (3) | (4) | (5) |

Table 9 contains the DC resistance for the sensors previously described, as a function of temperature, over the range of temperatures from 0 to 260° C. Column (1) of the Table reports the temperatures in degrees Centigrade, while columns (2) and (4) report the actual resistance measured at each of those temperatures using two crystals from crucible 1. Columns (3) and (5) represent the theoretical values calculated from the equation for the resistance R=exp($A_o$+ $A_1$/T+$A_2$/$T^2$+$A_3$/$T^3$). The Ai coefficients ($A_o$, $A_1$, $A_2$ and $A_3$) are presented in Tables 8 and 10. Thus the crystals produced in accordance with the present invention are widely useful as thermistors.

TABLE 10

Activation Energy (β) from data analysis in (25 to 125° C.) range - curve fit with T(K)
T (Kelvin) = [(37; 50; 70; 170; 190)° C. + 273.15]

| Specimen | Crystal 3 Glass encapsulated | Crystal 4 Glass encapsulated | GC-32 (F Material) Ceramic glass encapsulated |
|---|---|---|---|
| $A_o$ | −2.6687 | −5.3831 | |
| $A_1$ | +3.3932 × $10^3$ | +3.5690 × $10^3$ | |
| $A_2$ | +3.1310 × $10^5$ | +2.9345 × $10^5$ | |
| $A_3$ | −5.0440 × $10^7$ | −4.9170 × $10^7$ | |
| β (25–125)° C. | 3915° k. = 0.34 eV | 4008° k. = 0.35 eV | 3975° k. = 0.34 eV |

β = ($T_1$ $T_o$/($T_o$ − $T_1$)) ln $R_1$/$R_o$
eV = Electron Volts.
R = exp {$A_o$ + ($A_1$/T) + ($A_2$/$T^2$) + ($A_3$/$T^3$)}

The thermistor industry traditionally uses a beta value (β) which is defined as ($T_1$$T_o$/($T_o$−$T_1$)) in $R_1$/$R_o$ where T is in degrees Kelvin, when considering various thermosensitive materials. Beta is roughly analogous to the slope of the lines shown in FIGS. 8 and 9 relates to the sensitivity of the resistance of the material to a range of temperatures. The beta value for the specimen shown in FIG. 8 from crucible 1 (crystal 3) is 3915° K or 0.34 eV. The beta value for a second crystal (crystal 4) from crucible 1 shown in FIG. 9, was 4008° K or 0.35 eV. A sensor made of polycrystalline material available from Thermometrics Inc. of Edison, N.J. (designated as an F material) (GC-32) has a target beta value of 3975° K or 0.34 eV. Published values[2] for nickel-manganese oxide cubic spinel ceramics include beta values ranging from 0.33 to 0.36 eV.

EXAMPLE III

Monocrystals grown in accordance with the present invention were tested to illustrate their physical, structural and electrical differences from polycrystalline materials and to illustrate the usefulness of the monocrystalline material as a thermistor or temperature sensor. First, monocrystallineo material obtained from crucible 1 was tested to demonstrate the change in impedance at two temperatures, 25° C. and 125° C. Two sensors including monocrystals in accordance with the present invention and two similarly configured polycrystalline specimens were tested. The sensors described in Example II were used for this purpose.

The data obtained from 2 monocrystals retrieved from crucible 1, and polycrystals of a similar material, is contained in Table 11. Table 11 provides the DC resistance, the frequency and the corresponding impedance for the monocrystal and polycrystalline specimens tested. Data are provided at two isotherms of 25° C. and 125° C. These impedance values for the two selected isotherms are normalized to their DC resistance.

The data are plotted as a percent of normalized impedance loss as a function of the log of the AC frequency. See FIG. 11. The two 25° C. isotherms show a dramatic difference between the dispersion relations of the monocrystal and the polycrystal specimens. For example, at 10 KHz, the impedance drops by at least 83% for the two porous polycrystal specimens (Table 11, cols. 4, 5 and 6) compared to only 55% for the two monocrystal specimens (Table 11, cols. 2 and 3). The 125° C. isotherm is less sensitive to frequency. At 50 KHz a 4% loss is realized for the two monocrystals (Table 11, cols, 7 and 8) compared to at least a 29% loss for the two polycrystal specimens. Therefore, limits can be set on the achievable ceramic density by comparing it to the density of monocrystal sensors. This comparison allows for a figure of merit with regard to tests for process and quality controls of the required versus actual ceramic density.

TABLE 11

Normalized Percent Impedance Loss (A) As a Function Of AC Frequency (Hz), WHERE A = [(/Z/ − Ro)/Ro]*100, Ro = DC Resistance Impedance Loss A

| Frequency Hz | R = 30640* MONO 3 25 C | R = 30700* MONO 4 25 C | R = 93130* POLY 1 25 C | R = 93210* POLY 1 25 C | R = 98440* POLY 2 25 C | R = 1135* MONO 3 125 C | R = 1050* MONO 4 125 C | R = 3251* POLY 1 125 C | R = 3248* POLY 1 125 C | R = 3427* POLY 2 125 C |
|---|---|---|---|---|---|---|---|---|---|---|
| 1 | 0 | 0 | 0 | 0 | 0 | 0 | 0 | 0 | 0 | 0 |
| 10 | | | | | | | | | | |
| 100 | | −2.5 | | −2.96 | −4.82 | | .019 | | | |
| 200 | | | | −2.95 | −4.12 | | | | | |
| 300 | | | | −2.93 | −6.7 | | | | | |
| 400 | | | | −3.68 | −5.71 | | 0.667 | | | |
| 500 | | −3.48 | | −3.63 | −6.66 | −0.088 | 0 | | | |
| 600 | | | | | −8.22 | | | | | |
| 700 | | | | | −12.103 | | | | | |
| 750 | | −3.97 | | | | −0.088 | 0 | | | |
| 800 | | | | | −14.37 | | | | | |
| 900 | | | | | −14.95 | | | | | |
| 1000 | −4.488 | −4.94 | −15.62 | −15.97 | −18.17 | −0.088 | −0.04 | −0.092 | 0.09 | −0.064 |
| 1500 | | | | −24.73 | −29.74 | | | | | |
| 2000 | | −10.04 | | −36.33 | −39.16 | | −0.143 | | | |
| 2500 | | | | | −47.49 | | | | | |
| 3000 | | −16.62 | | −50.6 | −53.78 | | 0.143 | | | |
| 3500 | | | | | −58.84 | | | | | |
| 4000 | | −23.83 | | −60.67 | −63.21 | | 0.19 | | | |
| 5000 | | −30.5 | | −67.72 | −69.44 | | 0.124 | | | |
| 6000 | | −36.77 | | −72.54 | −74.06 | | 0.21 | | | |
| 7000 | | −42.36 | | −76.37 | −77.62 | | 0.124 | | | |
| 8000 | | −47.08 | | −79.04 | −80.25 | | 0.105 | | | |
| 9000 | | −51.25 | | −81.28 | −82.32 | | | | | |
| 10000 | −54.807 | −54.89 | −83.02 | −83.11 | −84.02 | −0.264 | 0.124 | −2.122 | −1.9 | −2.45 |
| 15000 | | | | | −89.2 | | | | −4.49 | −5.05 |
| 20000 | −74.977 | −74.91 | −91.33 | | −91.86 | −0.969 | −0.762 | | −7.54 | −8.39 |
| 30000 | −82.849 | −82.75 | −94.19 | | | −2.115 | | | −14.46 | −16.65 |
| 40000 | −86.63 | −86.82 | −95.6 | | | −3.26 | | | −21.82 | −23.67 |
| 50000 | −89.3 | −89.27 | −96.44 | | | −4.405 | −3.65 | −28.55 | −28.55 | −30.69 |
| 60000 | −90.93 | −90.94 | −96.98 | | | −5.639 | | | −34.66 | −36.8 |
| 70000 | −92.07 | −92.07 | −97.38 | | | −6.96 | | | −39.71 | −41.95 |
| 80000 | −92.92 | −92.92 | −97.66 | | | −8.458 | | | −44.2 | −46.42 |
| 90000 | −93.58 | −93.56 | −97.88 | | | −9.692 | | | −47.79 | −50.06 |
| 100000 | −94.46 | −94.44 | −98.06 | | −98.17 | −10.837 | −9.24 | −50.91 | −50.86 | −53.19 |
| 125000 | | | −98.37 | | | −14.573 | −12.11 | | | |
| 150000 | | | −98.56 | | | −17.26 | −14.47 | | | −63.26 |
| 175000 | | | −98.71 | | | −20.793 | −17.7 | | | |
| 200000 | | | −98.82 | | | −23.7 | −20.49 | | | −69.22 |
| 250000 | | | | | | | −17.17 | | | |
| 300000 | | | −98.88 | | | −18.767 | | | | |
| 400000 | | | | | | | | | | |

*ohms

The principles, preferred embodiments and modes of operation of the present invention have been described in the foregoing specification. The invention which is intended to be protected herein, however, is not to be construed as limited to the particular embodiments disclosed, since these are to be regarded as illustrative rather than restrictive. Variations and changes may be made by others without departing from the spirit and scope of the invention.

BIBLIOGRAPHY

The text of the references and in particular, the pages indicated below are hereby incorporated by reference.

(1) D. G. Wickham, "Solid-Phase Equilibria In The System NiO—$Mn_2O_3$—$O_2$", J. Inorg. Nucl. Chem., 26, (1964), 1369–1377.

(2) E. G. Larson, R. J. Arnott and D. G. Wickham, "Preparation, Semiconduction And Low-Temperature Magnetization of the System $Ni_{1-x}Mn_{2+x}O_4$" J. Phys. Chem. Solids, 23, (1962), 1771–1781.

(3) Gerard Villers and Robert Buhl, "Chimie Minérale-Préparation, Études Cristallines et Magnétiques du Manganate de Nickel $NiMn_2O_4$" C.R. Acad. Sc. Paris, 260, (1965) 3406–3409.

(4) H. Makram, "Growth of Nickel Manganate Monocrystals", Journal of Crystal Growth, 1, (1967), 325–326.

(5) V. A. M. Brabers and J. C. J. M. Terhell "Electrical Conductivity and Cation Valencies in Nickel Manganate", Thys. Stat. Sol. (a), 69, (1982), 325–332.

(6) E. M. Levin and Clyde McDaniel, J. Am. Ceram. Soc., 45, [8] 356 (1962) and in particular, FIG. 323 thereof.

(7) W. Mendenhall et al, "Mathematical Statistics with Applications", Duxbury Press, North Scituate, Mass., copyright 1973 by Wadsworth Publishing Co., Inc. of Belmott Calif., Ch. 11, pgs 375–424.

What we claim is:

1. A sensor capable of detecting temperatures within a range of between about −70° C. and about 200° C. comprising a sensing element consisting of monocrystalline nickel-manganese-oxide cubic spinel having a molar ratio R selected from the group consisting of from between 0.580 to 0.663, 0.671 to 0.672, and 0.680 to 0.807, each expressed R value plus or minus 0.003;wherein R=Mn/(Ni+Mn), and a pair of terminals in substantially ohmic contact with said sensing element, whereby electrical resistance between said terminals will vary with the temperature of said sensing element.

2. A sensor as claimed in claim 1 wherein said terminals are formed from metals selected from the group consisting of noble metals and their alloys and copper and its alloys.

3. The sensor of claim 1 further comprising a pair of leads with each of said leads being connected to one of said terminals.

4. The sensor of claim 1 further comprising a housing supporting and enclosing at least a portion of said element.

5. The sensor of claim 1 further comprising means for measuring the electrical resistance between said terminals to thereby measure the temperature of said element.

6. A method of providing a resistance in an electrical circuit related to an unknown temperature comprising the steps of:

exposing a sensing element consisting of at least a portion of a nickel-manganese-oxide cubic spinel monocrystal having a molar ratio R selected from the group consisting of from between 0.580 to 0.663, 0.671 to 0.672, and 0.680 to 0.807, each expressed R value plus or minus 0.003; wherein R=Mn/(Ni+Mn) to the unknown temperature so that said monocrystal reaches a temperature approximating said unknown temperature while said element is connected in said circuit.

7. The method of claim 6 further comprising the step of actuating said circuit to apply an alternating current through said element.

8. The method of claim 7 wherein said alternating current has a frequency above about 10 Hz.

9. The method of claim 6 further comprising the step of measuring said resistance of said sensing element to thereby measure said unknown temperature.

10. The method of claim 6 wherein said circuit includes at least at least one additional circuit element having electrical properties which vary with temperature, said additional circuit elements being exposed to said unknown temperature along with said sensing element, whereby the resistance of said sensing element and the electrical properties of said additional circuit elements will both vary with variations in said unknown temperature, said circuit being connected so that variations in said resistance of said sensing element counteract variations in said electrical properties of said additional circuit elements.

* * * * *

UNITED STATES PATENT AND TRADEMARK OFFICE
CERTIFICATE OF CORRECTION

PATENT NO. : 6,099,164
DATED : August 8, 2000
INVENTOR(S) : Rosen, et al.

It is certified that error appears in the above-identified patent and that said Letters Patent is hereby corrected as shown below:

Title Page, Item [75] before "Carol" insert --Dr.--.
Col. 11, line 28, "lines" should read --line,--.
Col. 11, line 33, "solar" should read --molar--.
Col. 12, line 49, "a" should read --$a^3$--.
Col. 12, line 62, "q" should read --g--.
Col. 13, line 1, "$K_3O_3$" should read --$Mn_2O_3$--
Col. 13, line 5, after "0.014" insert --%--.
Col. 13, line 31 "id" should read --is--.
Col. 13, line 62, delete "is".
Col. 16, line 2, "27.53" should read --27.52--.
Col. 17, line 23, "Molt" should read --Mol%--.
Col. 13, Table 9, column 1, line 2, "(C0)" should read --(°C)
Col. 19, line 64, "Ai" should read --$A_i$--.
Col. 20, line 24, "9 relates to" should read --9; relates the--.
Col 20, line 41, after "monocrystalline" delete "o".
Col. 24, line 4, after ")" insert --,--.
Col. 24, line 17, delete "at least" (second occurrence).

Signed and Sealed this

Seventeenth Day of April, 2001

*Attest:*

NICHOLAS P. GODICI

*Attesting Officer*     Acting Director of the United States Patent and Trademark Office